(12) United States Patent
Nakamura et al.

(10) Patent No.: US 10,017,604 B2
(45) Date of Patent: Jul. 10, 2018

(54) MODIFIED PHENOLIC RESIN, METHOD FOR PRODUCING MODIFIED PHENOLIC RESIN, MODIFIED EPOXY RESIN, METHOD FOR PRODUCING MODIFIED EPOXY RESIN, CURABLE RESIN COMPOSITION, CURED PRODUCT OF SAME, AND PRINTED WIRING BOARD

(71) Applicant: DIC Corporation, Tokyo (JP)

(72) Inventors: Takamitsu Nakamura, Ichihara (JP); Hajime Watanabe, Ichihara (JP); Koji Hayashi, Ichihara (JP); Yoshiaki Murata, Ichihara (JP)

(73) Assignee: DIC Corporation, Tokyo (JP)

( * ) Notice: Subject to any disclaimer, the term of this patent is extended or adjusted under 35 U.S.C. 154(b) by 258 days.

(21) Appl. No.: 14/784,771

(22) PCT Filed: Feb. 27, 2014

(86) PCT No.: PCT/JP2014/054917
§ 371 (c)(1),
(2) Date: Oct. 15, 2015

(87) PCT Pub. No.: WO2014/171193
PCT Pub. Date: Oct. 23, 2014

(65) Prior Publication Data
US 2016/0060384 A1    Mar. 3, 2016

(30) Foreign Application Priority Data

Apr. 19, 2013  (JP) ................. 2013-088375

(51) Int. Cl.
*C08G 8/28* (2006.01)
*C08G 59/20* (2006.01)
(Continued)

(52) U.S. Cl.
CPC .............. *C08G 61/02* (2013.01); *C08G 8/28* (2013.01); *C08G 59/08* (2013.01); *C08G 59/20* (2013.01);
(Continued)

(58) Field of Classification Search
CPC .................. C08G 63/00; C08G 8/28
(Continued)

(56) References Cited

U.S. PATENT DOCUMENTS

2014/0023969 A1    1/2014  Imada et al.

FOREIGN PATENT DOCUMENTS

JP    08-120039 A    5/1996
WO    2012/141165 A1    10/2012

OTHER PUBLICATIONS

International Search Report dated Jun. 3, 2014, issued for PCT/JP2014/054917.
(Continued)

*Primary Examiner* — Duc Truong
(74) *Attorney, Agent, or Firm* — Locke Lord LLP; James E. Armstrong, IV; Nicholas J. DiCeglie, Jr.

(57) ABSTRACT

Provided are a modified epoxy resin and a modified epoxy resin whose cured products exhibit good heat resistance and dielectric properties, methods for producing these, a curable resin composition, a cured product of the curable resin composition, and a printed wiring substrate. A modified phenolic resin comprises a phenolic resin structure (A), wherein at least one aromatic nucleus (a) in the phenolic resin structure (A) has, as a substituent, a structural segment (1) represented by structural formula (1) below:

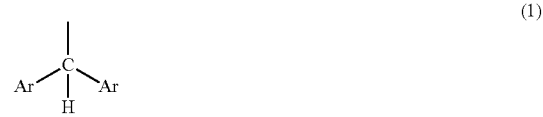

In the formula, Ar each independently represent a phenyl group, a naphthyl group, or a structural segment having, on
(Continued)

an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group.

12 Claims, 4 Drawing Sheets

(51) Int. Cl.
      *H05K 1/03*       (2006.01)
      *C08G 61/02*       (2006.01)
      *C08G 59/08*       (2006.01)
      *H05K 1/09*       (2006.01)
      *H05K 3/22*       (2006.01)
      *C08G 59/28*       (2006.01)

(52) U.S. Cl.
      CPC ............ *H05K 1/0366* (2013.01); *H05K 1/09* (2013.01); *H05K 3/22* (2013.01); *H05K 1/0326* (2013.01)

(58) Field of Classification Search
      USPC .............................................. 428/411, 411.1
      See application file for complete search history.

(56) References Cited

OTHER PUBLICATIONS

Office Action dated Jun. 15, 2016, issued for the Chinese patent application No. 201480022279.1 and Japanese translation thereof.

[Fig. 1]
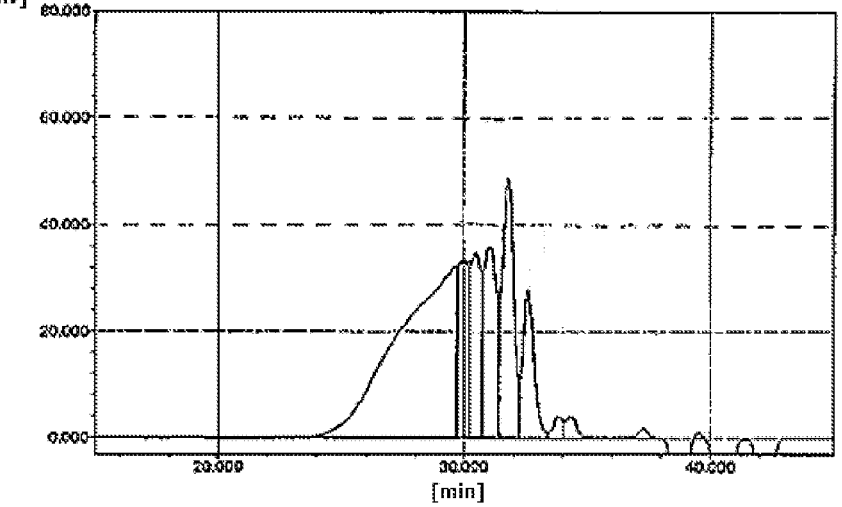
[Fig. 2]
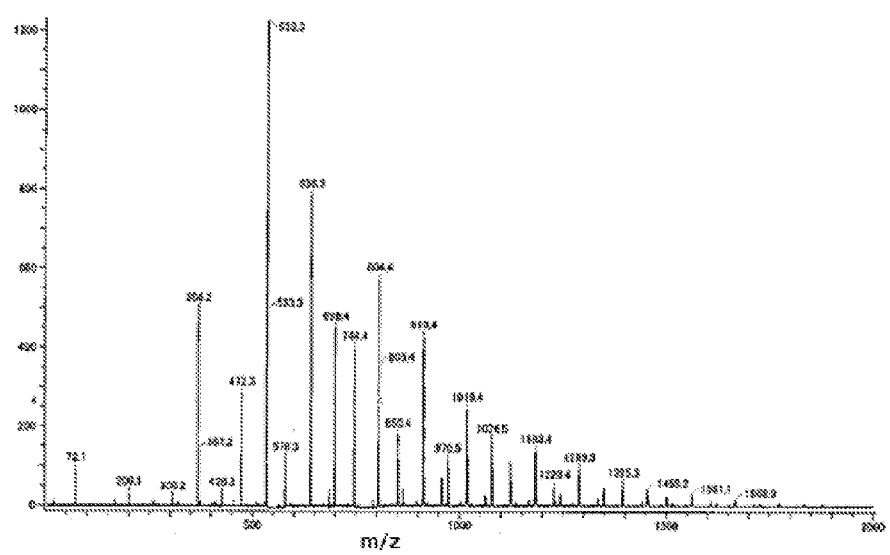

[Fig. 3]
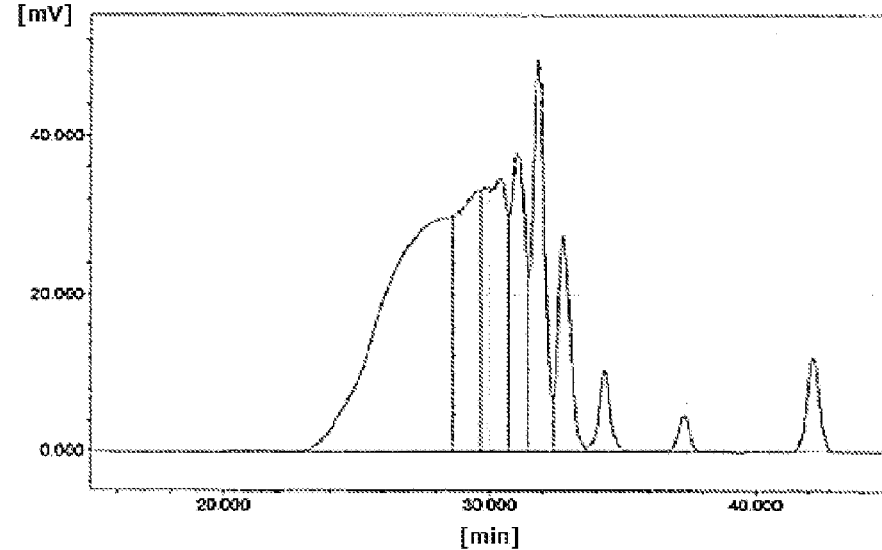
[Fig. 4]
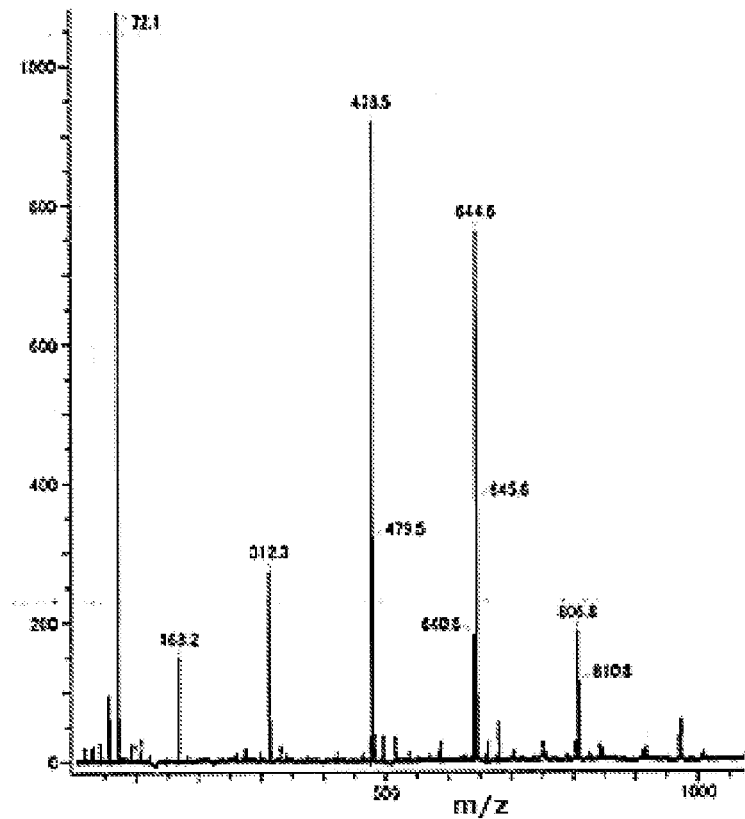

[Fig. 5]
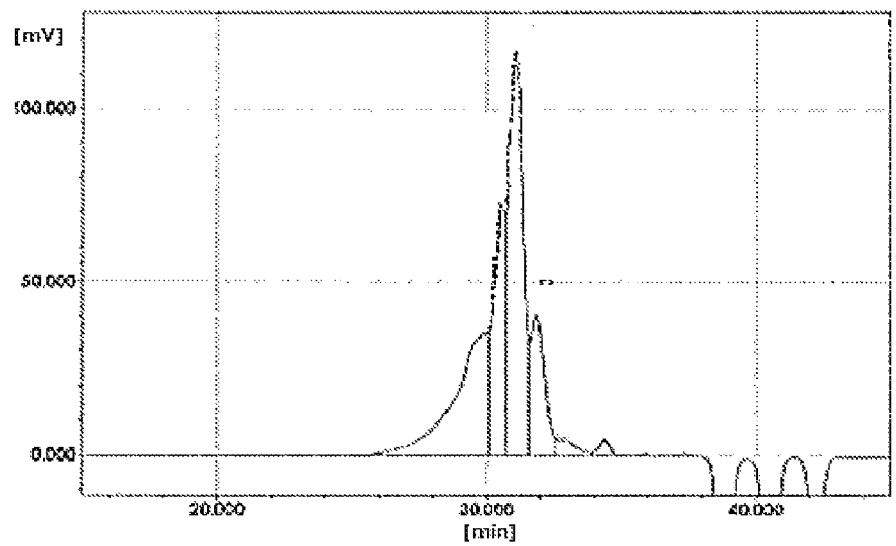
[Fig. 6]
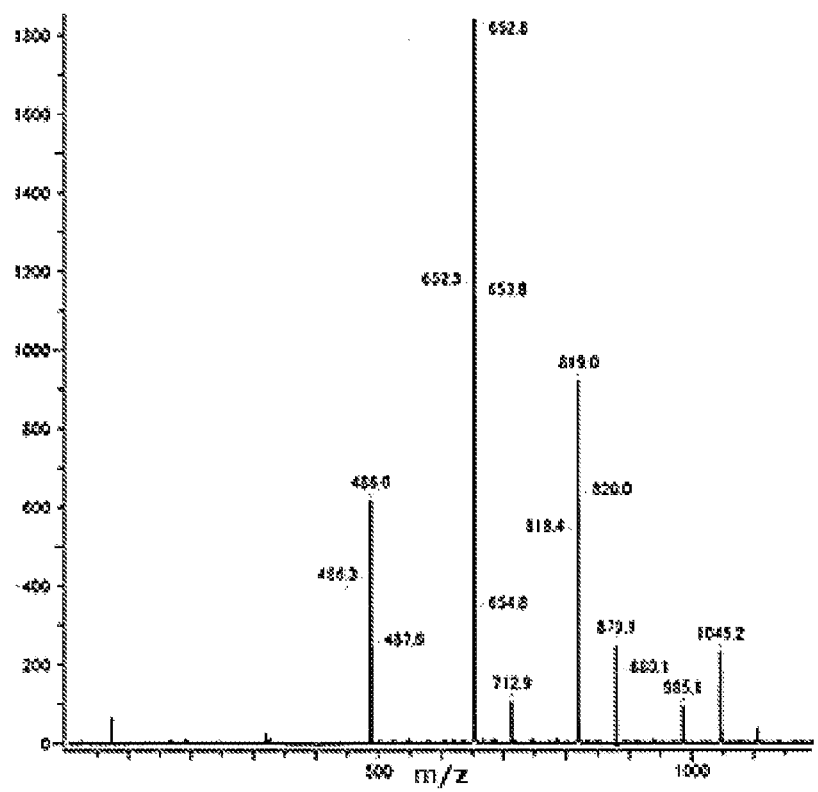

[Fig. 7]
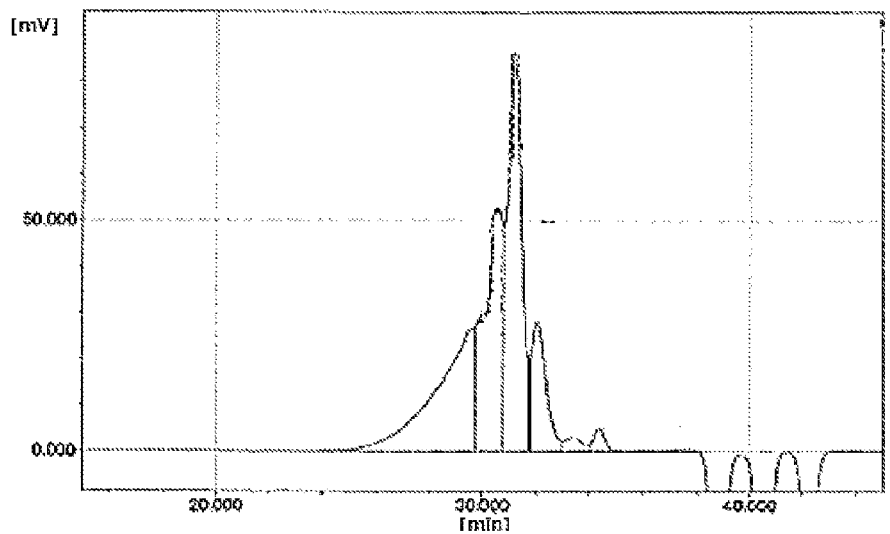
[Fig. 8]
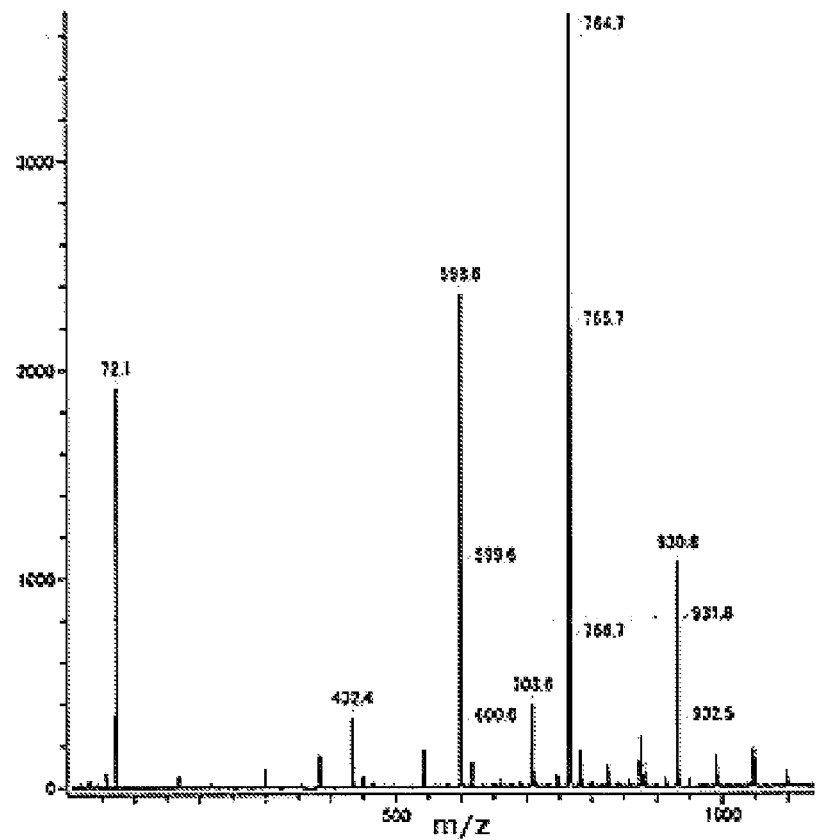

MODIFIED PHENOLIC RESIN, METHOD FOR PRODUCING MODIFIED PHENOLIC RESIN, MODIFIED EPOXY RESIN, METHOD FOR PRODUCING MODIFIED EPOXY RESIN, CURABLE RESIN COMPOSITION, CURED PRODUCT OF SAME, AND PRINTED WIRING BOARD

TECHNICAL FIELD

The present invention relates to a modified phenolic resin and a modified epoxy resin whose cured products exhibit good heat resistance and dielectric properties, methods for producing these, a curable resin composition, a cured product thereof, and a printed wiring substrate.

BACKGROUND ART

Curable resin compositions constituted by epoxy resins and curing agents therefor are widely used as semiconductor sealing materials and insulating materials for printed wiring substrates since the cured products thereof have good heat resistance, moisture resistance, insulating properties, and the like.

Especially for use in printed wiring substrates, a trend toward size reduction and increasing functions of electronic appliances has required narrower line pitches and high-density wiring. To meet this trend, the mainstream semiconductor mounting technique shifted from a conventional wire bonding technique to a flip-chip connecting technique with which semiconductor devices and wiring substrates are bonded to each other through solder balls. According to the flip-chip connecting technique, solder balls are placed between a wiring substrate and a semiconductor, and the entire structure is heated to cause solder reflow and achieve bonding; thus, insulating materials for wiring substrates having ever higher heat resistance are in demand. Moreover, the increasing signal speed and frequencies of electronic appliances require further reduction in dielectric constant and dielectric tangent as well as the improvements in heat resistance already mentioned.

Examples of insulating materials in the related art include a benzyl-modified epoxy resin obtained by reacting a phenolic resin and a benzylation reagent in the presence of an acid catalyst, and a benzyl-modified epoxy resin obtained by reacting the phenolic resin and an epihalohydrin (refer to PTL 1). These benzyl-modified phenolic resin and benzyl-modified epoxy resin have low water absorption in boiling water compared to the phenolic resin and the epoxy resin before benzylation; thus, although they have good solder cracking resistance, they exhibit significantly lowered heat resistance evaluated in terms of glass transition temperature. When the dielectric properties of the benzyl-modified phenolic resin and the benzyl-modified epoxy resin were evaluated, both the dielectric constant and the dielectric tangent were high, which did not meet the required levels of dielectric properties of the present date.

CITATION LIST

Patent Literature

[PTL 1] Japanese Unexamined Patent Application Publication No. 8-120039

SUMMARY OF INVENTION

Technical Problem

An object of the present invention is to provide a modified phenolic resin and a modified poxy resin whose cured products have good heat resistance and dielectric properties, methods for producing these, a curable resin composition, a cured product thereof, and a printed wiring substrate.

Solution to Problem

According to the extensive studies made to attain the object above by the inventors, it has been found that a modified phenolic resin obtained by modifying a phenol resin with a compound (II) represented by the following structural formula (3):

[Chem. 1]

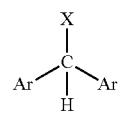

(3)

(In the formula, X represents a hydroxyl group or a halogen atom, Ar each independently represent a phenyl group, a naphthyl group, or a structural segment having, on an aromatic nucleus, at least one substituent selected from the group consisting of an alkyl group having 1 to 4 carbon atoms, an alkoxy group having 1 to 4 carbon atoms, a halogen atom, a phenyl group, and an aralkyl group), and a modified epoxy resin obtained by polyglycidyletherification of this modified phenolic resin have excellent heat resistance and dielectric properties. Thus, the present invention has been made.

In other words, the present invention relates to a modified phenolic resin comprising a phenolic resin structure (A), wherein at least one aromatic nucleus (a) in the phenolic resin structure (A) has, as a substituent, a structural segment (1) represented by structural formula (1) below:

[Chem. 2]

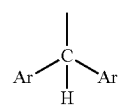

(1)

(In the formula, Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group).

The present invention also relates to a method for producing a modified phenolic resin, comprising inducing a phenolic resin (I) to react with a compound (II) represented by structural formula (3) below:

[Chem. 3]

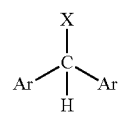

(3)

(In the formula, X represents a hydroxyl group or a halogen atom, and Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group), the reaction being conducted in such a manner that there is 0.1 to 2.0 mol of the compound (II) per mole of a phenolic hydroxyl group contained in the phenolic resin (I).

The present invention also relates to a modified epoxy resin comprising a polyglycidyl ether structure (B) of a phenolic resin, wherein at least one aromatic nucleus (a) in the polyglycidyl ether structure (B) of a phenolic resin has, as a substituent, a structural segment (1) represented by structural formula (1) below:

[Chem. 4]

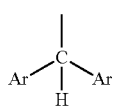

(1)

(In the formula, Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group).

The present invention also relates to a method for producing a modified epoxy resin, comprising inducing a phenolic resin (I) to react with a compound (II) represented by structural formula (3) below:

[Chem. 5]

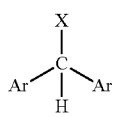

(3)

(In the formula, X represents a hydroxyl group or a halogen atom, and Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group), the reaction being conducted in such a manner that there is 0.1 to 2.0 mol of the compound (II) per mole of a phenolic hydroxyl group contained in the phenolic resin (I), and inducing the resulting modified phenolic resin to react with an epihalohydrin.

The present invention also relates to a curable resin composition comprising the modified phenolic resin described above and a curing agent.

The present invention also relates to a curable resin composition comprising the modified epoxy resin described above and a curing agent.

The present invention also relates to a cured product obtained by curing the curable resin composition described above.

The present invention also relates to a printed wiring substrate obtained by impregnating a reinforcing substrate with a varnish composition containing the curable resin composition described above and an organic solvent, placing a copper foil on the reinforcing substrate, and performing thermal press-bonding.

Advantageous Effects of Invention

According to the present invention, a modified epoxy resin and a modified poxy resin whose cured products exhibit good heat resistance and dielectric properties, methods for producing these, a curable resin composition, a cured product of the curable resin composition, and a printed wiring substrate can be provided.

BRIEF DESCRIPTION OF DRAWINGS

FIG. 1 is a GPC chart of a modified phenolic resin (1) obtained in Example 1.
FIG. 2 is an MS spectrum of the modified phenolic resin (1) obtained in Example 1.
FIG. 3 is a GPC chart of a modified epoxy resin (1) obtained in Example 2.
FIG. 4 is an MS spectrum of the modified epoxy resin (1) obtained in Example 2.
FIG. 5 is a GPC chart of a modified phenolic resin (2) obtained in Example 3.
FIG. 6 is an MS spectrum of the modified phenolic resin (2) obtained in Example 3.
FIG. 7 is a GPC chart of a modified epoxy resin (2) obtained in Example 4.
FIG. 8 is an MS spectrum of the modified epoxy resin (2) obtained in Example 4.

DESCRIPTION OF EMBODIMENTS

The present invention will now be described in detail.

A modified phenolic resin according to the present invention has a phenolic resin structure (A), and at least one aromatic nucleus (a) in the phenolic resin structure (A) has a structural segment (1) represented by the following structural formula (1) as a substituent:

[Chem. 6]

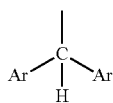

(1)

(In the formula, Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group).

This modified phenolic resin having the structural segment (1) represented by structural formula (1) in the molecular structure has a higher aromatic ring concentration than typical phenolic resins, and can decrease the dielectric constant and dielectric tangent of cured products. Despite the fact that incorporation of the structural segment (1) in the molecular structure may seem to decrease heat resistance of the cured product due to a phenolic hydroxyl group concentration lower than that of typical phenolic resins, there can be obtained a cured product having good heat resistance as well as low dielectric constant and low dielectric tangent due to the rigidity of the structural segment (1).

The modified phenolic resin of the present invention may take any specific structure so long as a phenolic skeleton is included in the molecular structure and the structural segment (1) is present on the aromatic nucleus. Examples of the phenolic resin structure (A) contained in the modified phenolic resin of the present invention include a bisphenol-type resin structure (A1), a novolac-type phenolic resin structure (A2), an aralkyl-type phenolic resin structure (A3), a resin structure (A4) having phenolic skeletons connected through an alicyclic hydrocarbon group, and a resin structure (A5) having a structural segment represented by structural formula (2) below:
[Chem. 7]

-Ph-M-An- (2)

(In the formula, Ph represents a phenolic-hydroxyl-group-containing aromatic hydrocarbon group, M represents a divalent hydrocarbon group selected from a methylene group, an alkylidene group, and an aromatic-hydrocarbon-structure-containing methylene group, and An represents an alkoxy-group-containing fused polycyclic aromatic hydrocarbon group).

Examples of the bisphenol-type resin structure (A1) include those structures which have bisphenol skeletons, such as bisphenol A, bisphenol F, or bisphenol S, in the molecular structures. Specific examples thereof include bisphenols such as bisphenol A, bisphenol F, and bisphenol S, phenolic resin structures obtained by reacting bisphenol compounds with epichlorohydrin, and phenolic resin structures obtained by reacting bisphenols with bisphenol-type epoxy resins.

Examples of the novolac-type phenolic resin structure (A2) include phenol novolac resins; cresol novolac resins having one or more cresol structures selected from ortho-cresol, para-cresol, and meta-cresol; naphthol novolac resins having one or both naphthol skeletons selected from α-naphthol and β-naphthol; dihydroxynaphthalene-type novolac resins having one or more dihydroxynaphthalene skeletons such as 1,2-dihydroxynaphthalene, 1,4-dihydroxynaphthalene, 1,5-dihydroxynaphthalene, 2,3-dihydroxynaphthalene, 2,6-dihydroxynaphthalene,and 2,7-dihydroxynaphthalene; bisphenol-type novolac resins having one or more bisphenol skeletons such as bisphenol A, bisphenol F, and bisphenol S; condensates of biphenyl-type novolac resins, phenolic compounds, and phenolic-hydroxyl-group-containing aromatic aldehydes; and mixed novolac resins having two or more phenolic skeletons selected from the group consisting of phenol, cresol, naphthol, dihydroxynaphthalene, bisphenol, and biphenyl.

Examples of the aralkyl-type phenolic resin structure (A3) include resin structures represented by any one of the following structural formulae (4-1) to (4-5):

[Chem. 8]

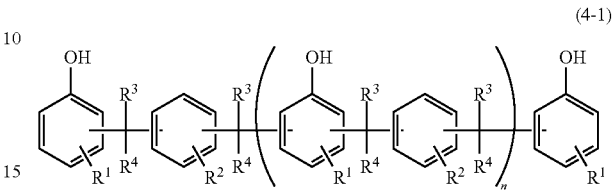

(In the formula, $R^1$ and $R^2$ each independently represent a hydrogen atom or an alkyl group having 1 to 4 carbon atoms, $R^3$ and $R^4$ each independently represent a hydrogen atom or a methyl group, and n represents an integer of 0 to 10)

[Chem. 9]

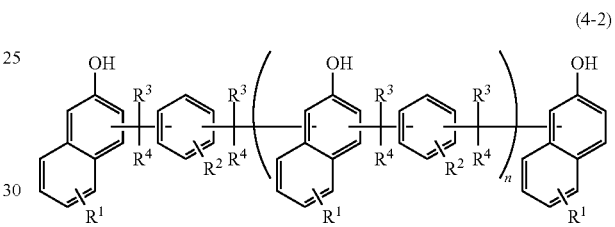

(In the formula $R^1$ and $R^2$ each independently represent a hydrogen atom or an alkyl group having 1 to 4 carbon atoms, $R^3$ and $R^4$ each independently represent a hydrogen atom or a methyl group, and n represents an integer of 0 to 10)

[Chem. 10]

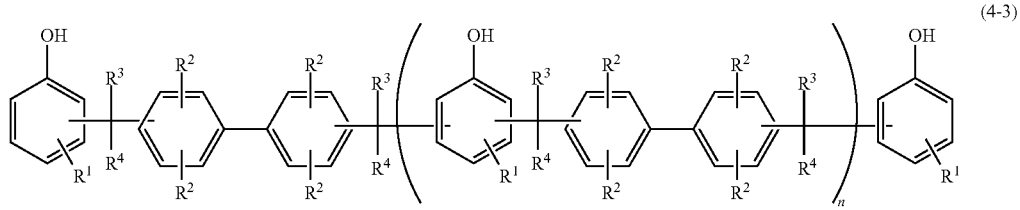

(In the formula $R^1$ and $R^2$ each independently represent a hydrogen atom or an alkyl group having 1 to 4 carbon atoms, $R^3$ and $R^4$ each independently represent a hydrogen atom or a methyl group, and n represents an integer of 0 to 10)

[Chem. 11]

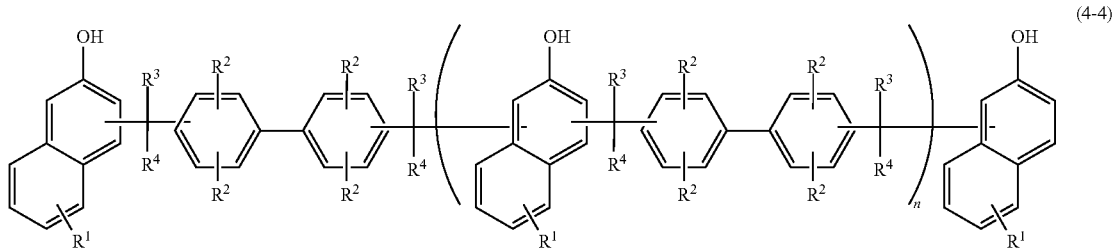

(In the formula R¹ and R² each independently represent a hydrogen atom or an alkyl group having 1 to 4 carbon atoms, R³ and R⁴ each independently represent a hydrogen atom or a methyl group, and n represents an integer of 0 to 10)

[Chem. 12]

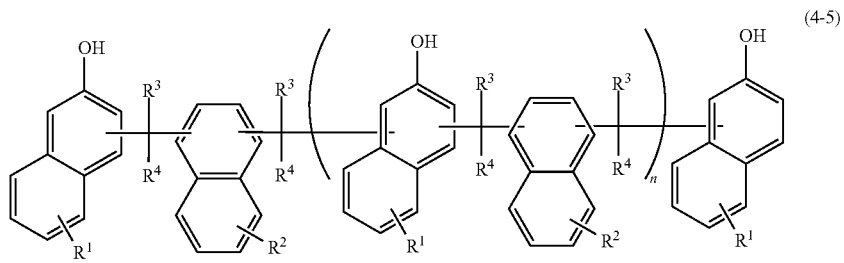
(4-5)

(In the formula R¹ and R² each independently represent a hydrogen atom or an alkyl group having 1 to 4 carbon atoms, R³ and R⁴ each independently represent a hydrogen atom or a methyl group, and n represents an integer of 0 to 10).

Examples of the resin structure (A4) having phenolic skeletons connected through an alicyclic hydrocarbon group include resin structures having phenolic skeletons connected through an alicyclic hydrocarbon group selected from the group consisting of dicyclopentadiene, tetrahydroindene, 4-vinylcyclohexene, 5-vinylnorbornan-2-ene, α-pinene, β-pinene, and limonene. Specific examples thereof include resin structures represented by the following structural formula (5):

[Chem. 13]

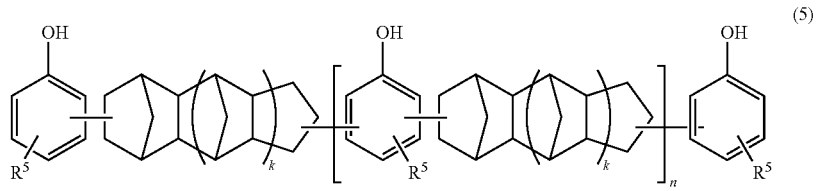
(5)

(In the formula, R⁵ represents a hydrogen atom, an alkyl group having 1 to 4 carbon atoms, or a phenyl group, and n represents an integer of 0 to 10).

Examples of the resin structure (A5) having a structural segment represented by structural formula (2) below:
[Chem. 14]

-Ph-M-An-       (2)

(In the formula, Ph represents a phenolic-hydroxyl-group-containing aromatic hydrocarbon group, M represents a divalent hydrocarbon group selected from a methylene group, an alkylidene group, and aromatic-hydrocarbon-structure-containing methylene group, and An represents an alkoxy-group-containing fused polycyclic aromatic hydrocarbon group) include straight-chain resin structures represented by structural formulae (2-1) and (2-2) below:
[Chem. 15]

Ph-M-An-M-Ph       (2-1)

An-M-Ph-M-Ph-M-An       (2-2)

and resin structures whose repeating units are structural segments represented by structural formula (2-3) to (2-8) below:

[Chem. 16]

—Ph—M—       (2-3)

—Ph—M—
    |
    M
    |       (2-4)

-continued

—Ph—M—An—M—       (2-5)

—Ph—M—An—M—
    |
    M
    |       (2-6)

—Ph—M—An—M—
           |
           M
           |       (2-7)

—Ph—M—An—M—
    |          |
    M        M
    |          |       (2-8)

and molecular terminal is a structural segment represented by structural formula (2-9) below:
[Chem. 17]

-M-An       (2-9)

Specific examples of the phenolic-hydroxyl-group-containing aromatic hydrocarbon group represented by Ph in the structural formulae (2) and (2-1) to (2-9) include structural segments represented by structural formulae (Ph1) to (Ph16) below:
[Chem. 18]
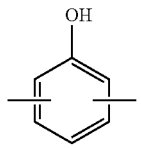
Ph1
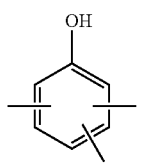
Ph2
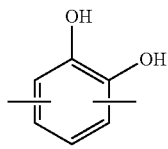
Ph3
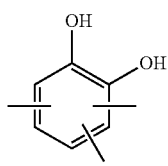
Ph4
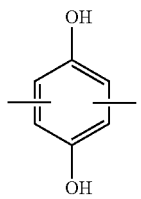
Ph5
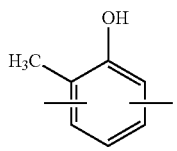
Ph6
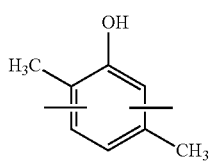
Ph7
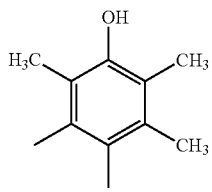
Ph8
-continued
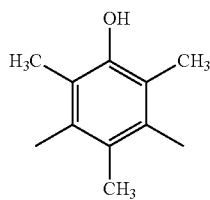
Ph9
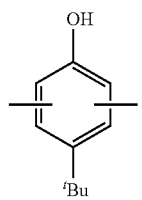
Ph10
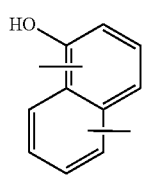
Ph11
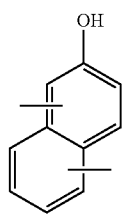
Ph12
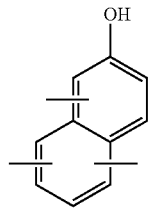
Ph13
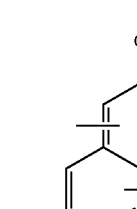
Ph14
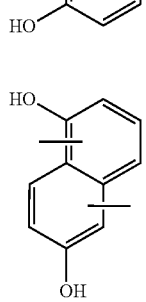
Ph15

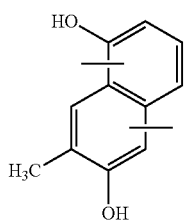
Ph16

In the structural formulae (2) and (2-1) to (2-9), in the case where the phenolic-hydroxyl-group-containing aromatic hydrocarbon group represented by Ph is located at a molecular terminal, the structural segment represented by any one of (Ph1) to (Ph16) is a monovalent aromatic hydrocarbon group. Among the structures described above, those having, on the naphthalene skeleton, two or more bonding sites with other structural segments may have these bonding sites located on the same nucleus or different nuclei.

Specific examples of the alkoxy-group-containing fused polycyclic aromatic hydrocarbon group represented by An in the structural formulae (2) and (2-1) to (2-9) include structural segments represented by structural formulae (An1) to (An12) below:

[Chem. 19]

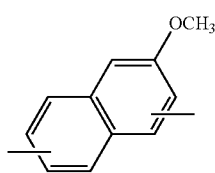
An1

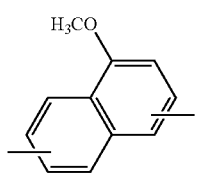
An2

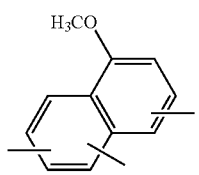
An3

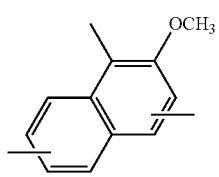
An4

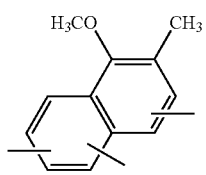
An5

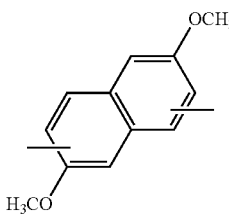
An6

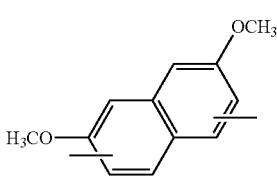
An7

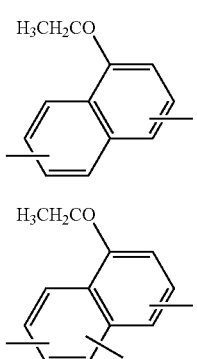
An8

An9

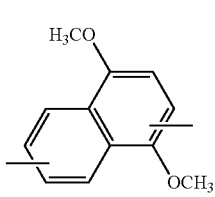
An10

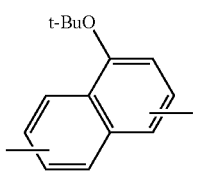
An11

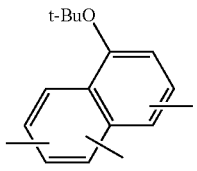
An12

In the structural formulae (2) and (2-1) to (2-9), in the case where the alkoxy-group-containing fused polycyclic aromatic hydrocarbon group represented by An is located at a molecular terminal, the structural segment represented by any one of (An1) to (An12) above is a monovalent aromatic hydrocarbon group. Among the structures described above, those having, on the naphthalene skeleton, two or more bonding sites with other structural segments may have these bonding sites located on the same nucleus or different nuclei.

In the structural formulae (2) and (2-1) to (2-9), the structural segment represented by M is a divalent hydrocarbon group selected from a methylene group, an alkylidene group, and an aromatic-hydrocarbon-structure-containing methylene group. Examples of the alkylidene group include an ethylidene group, a 1,1-propylidene group, a 2,2-propylidene group, a dimethylene group, a propane-1,1,3,3-tetrayl group, an n-butane-1,1,4,4-tetrayl group, and an n-pentane-1,1,5,5-tetrayl group. Specific examples of the aromatic-hydrocarbon-structure-containing methylene group include structural segments represented by structural formulae (M1) to (M8) below:

[Chem. 20]

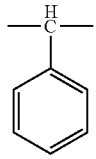

M1

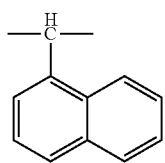

M2

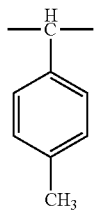

M3

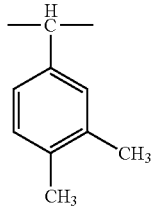

M4

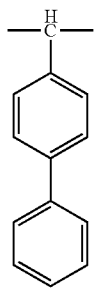

M5

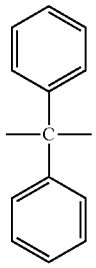

M6

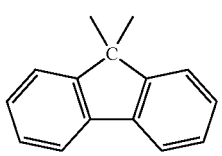

M7

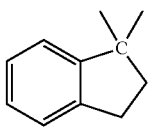

M8

Among these, the structural segment represented by M in the structural formulae (2) and (2-1) to (2-9) is preferably a methylene group since good dielectric effects can be obtained.

The modified phenolic resin according to the present invention is preferably one having the novolac-type phenolic resin structure (A2) or the resin structure (A4) having phenolic skeletons connected through an alicyclic hydrocarbon group among the phenolic resin structures (A) described above since a cured product thereof exhibits good heat resistance and dielectric properties.

The novolac-type phenolic resin structure (A2) preferably has a structure selected from a phenol novolac resin, a cresol novolac resin having one or more cresol skeletons selected from ortho-cresol, para-cresol, and meta-cresol, a naphthol novolac resin having one or both naphthol skeletons selected from α-naphthol and β-naphthol, and a mixed novolac resin having two or more phenolic skeletons selected from the group consisting of phenol, cresol, and naphthol since cured products with well-balanced heat resistance and dielectric properties, and good flame retardancy can be obtained. One having a phenol novolac resin structure is particularly preferable.

The resin structure (A4) having phenolic skeletons connected through an alicyclic hydrocarbon group is preferably a resin structure having phenolic skeletons connected through a dicyclopentadiene skeleton since cured products having better dielectric properties can be obtained. Specifically, a resin structure represented by structural formula (5) below is preferable:

[Chem. 21]

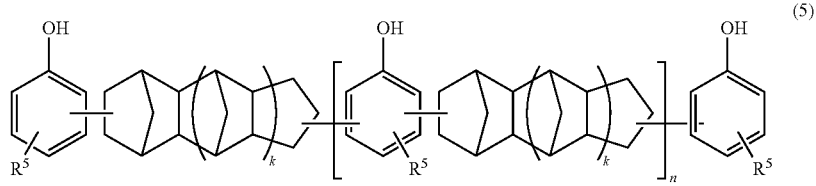

(5)

(In the formula, $R^5$ represents a hydrogen atom, an alkyl group having 1 to 4 carbon atoms, or a phenyl group, and n represents an integer of 0 to 10.)

The modified phenolic resin of the present invention has, as a substituent on the aromatic nucleus (a), the structural segment (1) represented by structural formula (1) below:

[Chem. 22]

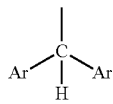
(1)

(In the formula, Ar each independently represent a phenyl group, a naphthyl group, or a structural segment having, on an aromatic nucleus, at least one substituent selected from the group consisting of an alkyl group having 1 to 4 carbon atoms, an alkoxy group having 1 to 4 carbon atoms, a halogen atom, a phenyl group, and an aralkyl group).

The two Ar in the structural segment (1) each independently represent a phenyl group, a naphthyl group, or a structural segment having, on an aromatic nucleus, at least one substituent selected from the group consisting of an alkyl group having 1 to 4 carbon atoms, an alkoxy group having 1 to 4 carbon atoms, a halogen atom, a phenyl group, and an aralkyl group. In particular, each Ar preferably represents a phenyl group or a naphthyl group since a cured product having good heat resistance and dielectric properties can be obtained, and preferably represents a phenyl group since the modified phenolic resin can be easily produced.

The ratios of the phenolic hydroxyl group and the structural segment represented by structural formula (1) above present in the modified phenolic resin of the present invention are preferably adjusted so that there is 0.1 to 2.0 mol of the structural segment represented by the structural formula (1) per mole of the phenolic hydroxyl group since a cured product with good heat resistance and dielectric properties can be obtained. More preferably, there is 0.4 to 1.2 mol of the structural segment represented by the structural formula (1) per mole of the phenolic hydroxyl group since a modified phenolic resin also having good solvent solubility can be obtained.

The hydroxyl equivalent of the modified phenolic resin of the present invention is preferably in the range of 150 to 400 g/equiv since good reactivity can be achieved and a cured product exhibits well-balanced heat resistance and dielectric properties.

The modified phenolic resin of the present invention can be prepared by, for example, inducing a phenolic resin (I) to react with a compound (II) represented by structural formula (3) below:

[Chem. 23]

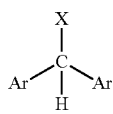
(3)

(In the formula, X represents a hydroxyl group or a halogen atom, and Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group).

Examples of the phenolic resin (I) which is one of the raw materials of the modified phenolic resin include those having various phenolic resin structures whose examples are described above as the phenolic resin structure (A). Specific examples thereof include a bisphenol-type resin (I1), a novolac-type phenolic resin (I2), an aralkyl-type phenolic resin (I3), a resin structure (I4) having phenolic skeletons connected through an alicyclic hydrocarbon group, and a resin (I5) represented by the following structural formula (2):

[Chem. 24]

(2)

(In the formula, Ph represents a phenolic-hydroxyl-group-containing aromatic hydrocarbon group, M represents a divalent hydrocarbon group selected from a methylene group, an alkylidene group, and an aromatic-hydrocarbon-structure-containing methylene group, and An represents an alkoxy-group-containing fused polycyclic aromatic hydrocarbon group).

The structural features of these phenolic resins (I) are as described in detail in the description of the phenolic resin structure (A). In particular, the novolac-type phenolic resin (I2) or the resin structure (I4) having phenolic skeletons connected through an alicyclic hydrocarbon group is preferable since cured products will exhibit good heat resistance and dielectric properties.

The novolac-type phenolic resin (I2) is preferably one selected from a phenol novolac resin, a cresol novolac resin having one or more cresol skeletons selected from ortho-cresol, para-cresol, and meta-cresol, a naphthol novolac resin having one or both naphthol skeletons selected from α-naphthol and β-naphthol, and a mixed novolac resin having two or more phenolic skeletons selected from the group consisting of phenol, cresol, and naphthol since cured products with well-balanced heat resistance and dielectric properties, and good flame retardancy can be obtained. A phenol novolac resin is particularly preferable.

The resin structure (I4) having phenolic skeletons connected through an alicyclic hydrocarbon group preferably has a resin structure having phenolic skeletons connected through a dicyclopentadiene skeleton since cured products with better dielectric properties can be obtained. Specifically, a dicyclopentadiene-modified phenolic resin represented by structural formula (5) below is more preferable:

[Chem. 25]

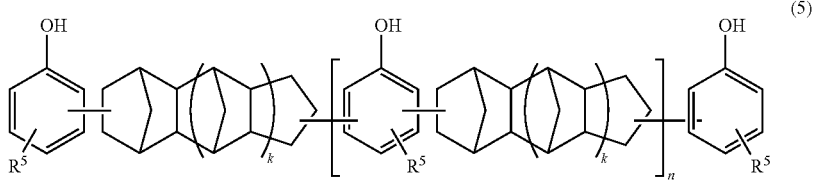
(5)

(In the formula, $R^5$ represents a hydrogen atom, an alkyl group having 1 to 4 carbon atoms, or a phenyl group, and n represents an integer of 0 to 10).

The compound (II), which is another raw material of the modified phenolic resin, has a molecular structure represented by the structural formula (3). In particular, Ar in the structural formula (3) preferably represents a phenyl group or a naphthyl group since a cured product having good heat resistance and dielectric properties can be obtained, and preferably represents a phenyl group since modified phenolic resins can be easily produced.

The reaction of the phenolic resin (I) and the compound (II) is preferably conducted at such a ratio that there is 0.1 to 2.0 mol of the compound (II) per mole of the phenolic hydroxyl group contained in the phenolic resin (I) since a cured product with good heat resistance and dielectric properties can be obtained. More preferably, there is 0.4 to 1.2 mol of the compound (II) per mole of the phenolic hydroxyl group contained in the phenolic resin (I) since a modified phenolic resin also having good solvent solubility can be obtained.

The reaction of the phenolic resin (I) and the compound (II) can be conducted under a temperature condition of 80° C. to 180° C. in the presence of an acid catalyst, for example. Examples of the acid catalyst that can be used include inorganic acids such as phosphoric acid, sulfuric acid, and hydrochloric acid, organic acids such as oxalic acid, benzene sulfonic acid, toluenesulfonic acid, methanesulfonic acid, and fluoromethanesulfonic acid, and Friedel-Crafts catalysts such as aluminum chloride, zinc chloride, stannic dichloride, ferric chloride, and diethyl sulfate. Among these, organic acids are preferred due to their high reactivity, and toluenesulfonic acid is more preferable. The amount of the catalyst used during reaction is preferably in the range of 0.01 to 5.0 parts by mass relative to 100 parts by mass of the reaction raw materials since sufficient catalytic performance is achieved.

The reaction of the phenolic resin (I) and the compound (II) may be performed in an organic solvent, if needed. Examples of the organic solvent used include ketone solvents such as acetone, methyl ethyl ketone, and cyclohexanone, acetic acid ester solvents such as ethyl acetate, butyl acetate, cellosolve acetate, propylene glycol monomethyl ether acetate, and carbitol acetate, carbitol solvents such as cellosolve and butyl carbitol, aromatic hydrocarbon solvents such as toluene and xylene, dimethyl formamide, dimethyl acetamide, and N-methylpyrrolidone.

After termination of the reaction, the reaction product may be neutralized, washed with water, and the like so as to obtain a target modified phenolic resin.

The modified epoxy resin of the present invention has a polyglycidyl ether structure (B) of a phenolic resin, and at least one aromatic nucleus (a) in the polyglycidyl ether structure (B) of a phenolic resin has, as a substituent, a structural segment (1) represented by the following structural formula (1):

[Chem. 26]

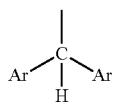
(1)

(In the formula, Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group).

The modified epoxy resin has the same features as the modified phenolic resin described above. In other words, due to the presence of the structural segment (1) represented by the structural formula (1) in the molecular structure, the aromatic ring concentration is high compared to typical epoxy resins and the cured product thereof exhibits lower dielectric constant and dielectric tangent. Despite the fact that incorporation of the structural segment (1) in the molecular structure may seem to decrease heat resistance of the cured product due to a low epoxy group concentration compared to typical epoxy resins, the cured product will exhibit good heat resistance as well as low dielectric constant and low dielectric tangent due to the rigidity of the structural segment (1).

The modified epoxy resin of the present invention may have any specific structure so long as the polyglycidyl ether structure (B) of a phenolic resin is contained and the structural segment (1) is on the aromatic nucleus. Examples of the polyglycidyl ether structure (B) of a phenolic resin contained in the modified phenolic resin of the present invention include a polyglycidyl ether structure (B1) of a bisphenol-type resin, a polyglycidyl ether structure (B2) of a novolac-type phenolic resin, a polyglycidyl ether structure (B3) of an aralkyl-type phenolic resin, a polyglycidyl ether structure (B4) of a resin having phenolic skeletons connected through an alicyclic hydrocarbon group, and a resin structure (B5) represented by structural formula (6) below:

[Chem. 27]

-Ph-M-An- (6)

(In the formula, Ph represents a glycidyloxy-group-containing aromatic hydrocarbon group, M represents a divalent hydrocarbon group selected from a methylene group, an alkylidene group, and an aromatic-hydrocarbon-structure-containing methylene group, and An represents an alkoxy-group-containing fused polycyclic aromatic hydrocarbon group).

Examples of the polyglycidyl ether structure (B1) of a bisphenol-type resin include epoxy resin structures having bisphenol skeletons, such as bisphenol A, bisphenol F, and bisphenol S, in the molecular structures. Specific examples thereof include an epoxy resin structure obtained by reacting a bisphenol compound, such as bisphenol A, bisphenol F, or bisphenol S, and epichlorohydrin, and an epoxy resin structure obtained by reacting bisphenol and a bisphenol-type epoxy resin.

Examples of the polyglycidyl ether structure (B2) of a novolac-type phenolic resin include the following resin structures: phenol novolac-type epoxy resins; cresol novolac-type epoxy resins that have at least one cresol skeleton selected from ortho-cresol, para-cresol, and meta-cresol; naphthol novolac-type epoxy resins having one or both naphthol skeletons selected from α-naphthol and β-naphthol; dihydroxynaphthalene novolac-type epoxy resins having one or more dihydroxynaphthalene skeletons such as 1,2-dihydroxynaphthalene, 1,4-dihydroxynaphthalene, 1,5-dihydroxynaphthalene, 2,3-dihydroxynaphthalene, 2,6-dihydroxynaphthalene, or 2,7-dihydroxynaphthalene; bisphenol novolac-type epoxy resins containing one or more bisphenol skeletons such as bisphenol A, bisphenol F, and bisphenol S; a polyglycidyl ether of a condensate of a biphenyl novolac-type epoxy resin, a phenolic compound, and a phenolic-hydroxyl-group-containing aromatic aldehyde; and a mixed novolac-type epoxy resin containing two or more phenolic skeletons selected from phenol, cresol, naphthol, dihydroxynaphthalene, bisphenol, and biphenyl.

Examples of the polyglycidyl ether structure (B3) of an aralkyl-type phenolic resin include resin structures represented by the following structural formulae (7-1) to (7-5):

[Chem. 28]

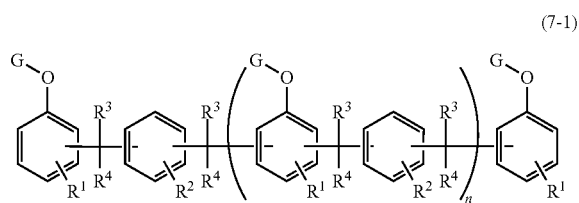

(7-1)

(In the formula, $R^1$ and $R^2$ each independently represent a hydrogen atom or an alkyl group having 1 to 4 carbon atoms, $R^3$ and $R^4$ each independently represent a hydrogen atom or a methyl group, G represents a glycidyl group, and n represents an integer of 0 to 10)

[Chem. 29]

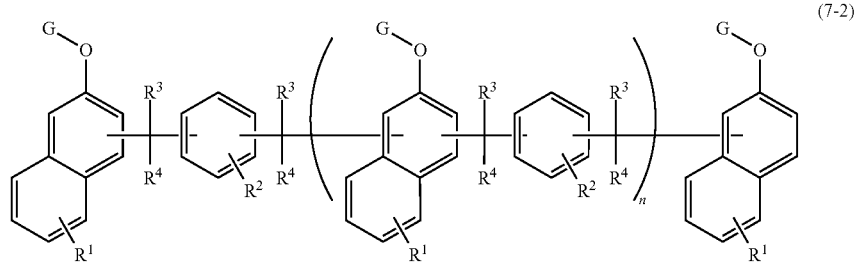

(7-2)

(In the formula, $R^1$ and $R^2$ each independently represent a hydrogen atom or an alkyl group having 1 to 4 carbon atoms, $R^3$ and $R^4$ each independently represent a hydrogen atom or a methyl group, G represents a glycidyl group, and n represents an integer of 0 to 10)

[Chem. 30]

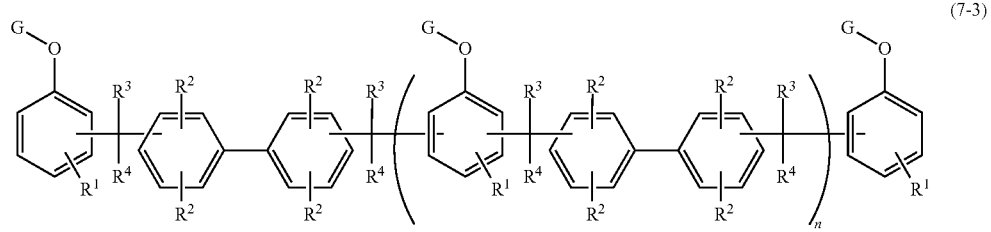

(7-3)

(In the formula, $R^1$ and $R^2$ each independently represent a hydrogen atom or an alkyl group having 1 to 4 carbon atoms, $R^3$ and $R^4$ each independently represent a hydrogen atom or a methyl group, G represents a glycidyl group, and n represents an integer of 0 to 10)

[Chem. 31]

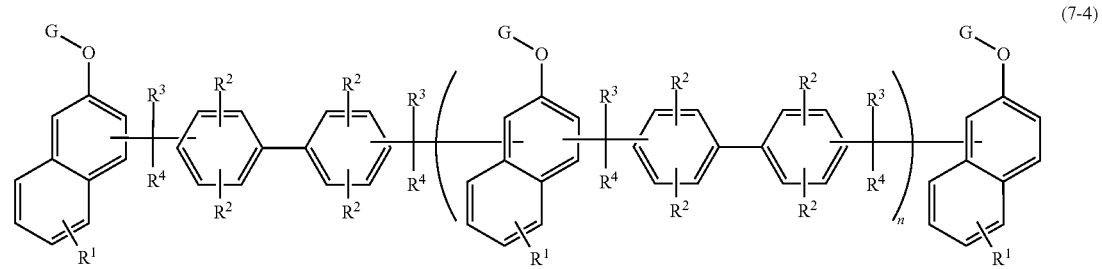

(7-4)

(In the formula, $R^1$ and $R^2$ each independently represent a hydrogen atom or an alkyl group having 1 to 4 carbon atoms, $R^3$ and $R^4$ each independently represent a hydrogen atom or a methyl group, G represents a glycidyl group, and n represents an integer of 0 to 10)

[Chem. 32]

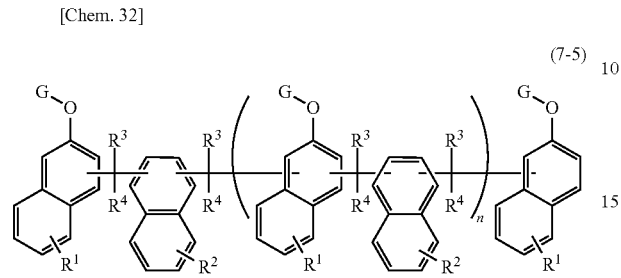

(7-5)

(In the formula, $R^1$ and $R^2$ each independently represent a hydrogen atom or an alkyl group having 1 to 4 carbon atoms, $R^3$ and $R^4$ each independently represent a hydrogen atom or a methyl group, G represents a glycidyl group, and n represents an integer of 0 to 10).

Examples of the polyglycidyl ether structure (B4) of a resin having phenolic skeletons connected through an alicyclic hydrocarbon group include a polyglycidyl ether structure derived from a resin having phenolic skeletons connected through an alicyclic hydrocarbon group selected from the group consisting of dicyclopentadiene, tetrahydroindene, 4-vinylcyclohexene, 5-vinylnorbornan-2-ene, α-pinene, β-pinene, and limonene. Specific examples thereof include resin structures represented by the following structural formula (8):

[Chem. 33]

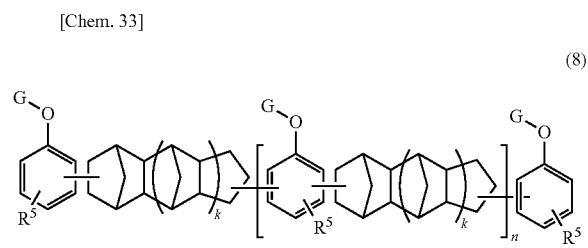

(8)

(In the formula, $R^5$ represents a hydrogen atom, an alkyl group having 1 to 4 carbon atoms, or a phenyl group, G represents a glycidyl group, and n represents an integer of 0 to 10).

Examples of the resin structure (B5) containing a structural segment represented by the following structural formula (6):

[Chem. 34]

-Ph-M-An- (6)

(In the formula, Ph represents a glycidyloxy-group-containing aromatic hydrocarbon group, M represents a divalent hydrocarbon group selected from a methylene group, an alkylidene group, and an aromatic-hydrocarbon-structure-containing methylene group, and An represents an alkoxy-group-containing fused polycyclic aromatic hydrocarbon group) include straight-chain resin structures represented by structural formulae (6-1) and (6-2) below:

[Chem. 35]

Ph-M-An-M-Ph (6-1)

An-M-Ph-M-Ph-M-An (6-2)

and resin structures whose repeating units are structural segments represented by the following structural formulae (6-3) to (6-8):

[Chem. 36]

—Ph—M— (6-3)

—Ph—M— (6-4)
|
M
|

—Ph—M—An—M— (6-5)

—Ph—M—An—M— (6-6)
|
M
|

—Ph—M—An—M— (6-7)
          |
          M
          |

—Ph—M—An—M— (6-8)
|         |
M         M
|         | and molecular terminal is a structural segment represented by the following structural formula (6-9):

[Chem. 37]

-M-An (6-9)

Specific examples of the glycidyloxy-containing aromatic hydrocarbon group represented by Ph in the structural formulae (6) and (6-1) to (6-9) include structural segments represented by the following structural formulae (Ph17) to (Ph32):

[Chem. 38]

Ph17

Ph18

Ph19

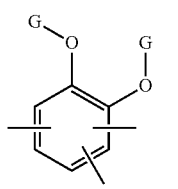
Ph20

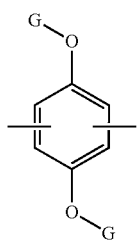
Ph21

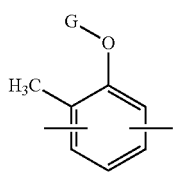
Ph22

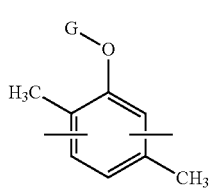
Ph23

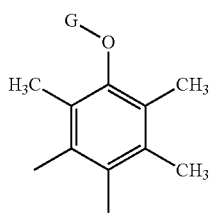
Ph24

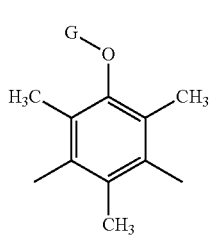
Ph25

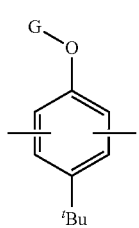
Ph26

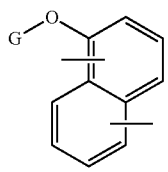
Ph27

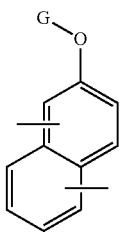
Ph28

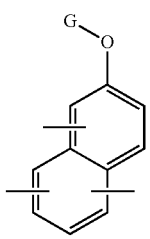
Ph29

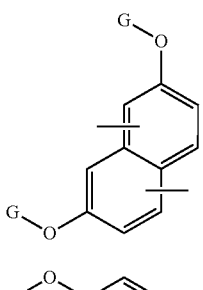
Ph30

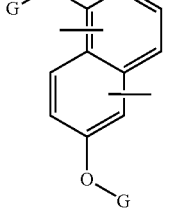
Ph31

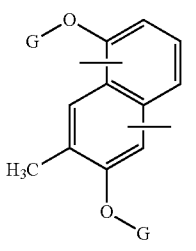
Ph32

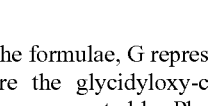

(In the formulae, G represents a glycidyl group.) In the case where the glycidyloxy-containing aromatic hydrocarbon group represented by Ph in the structural formulae (6) and (6-1) to (6-9) is located at a molecular terminal, the structural segment represented by any one of (Ph17) to (Ph32) is a monovalent aromatic hydrocarbon group. Among the structures described above, those having, on the naphthalene skeleton, two or more bonding sites with other structural segments may have these bonding sites located on the same nucleus or different nuclei.

Specific examples of the alkoxy-group-containing fused polycyclic aromatic hydrocarbon group represented by An in the structural formulae (6) and (6-1) to (6-9) include structural segments represented by the following structural formulae (An1) to (An12):

[Chem. 39]

An1 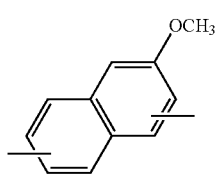

An2 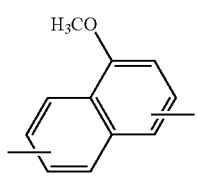

An3 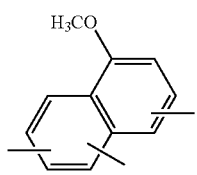

An4 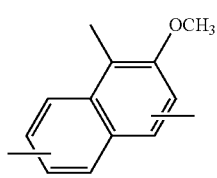

An5 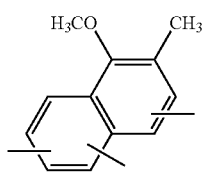

An6 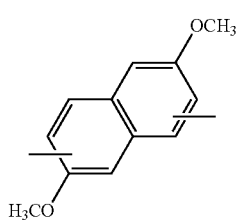

An7 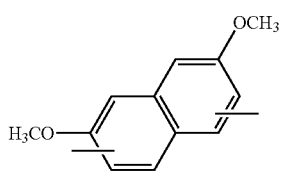

An8 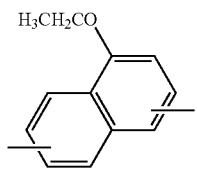

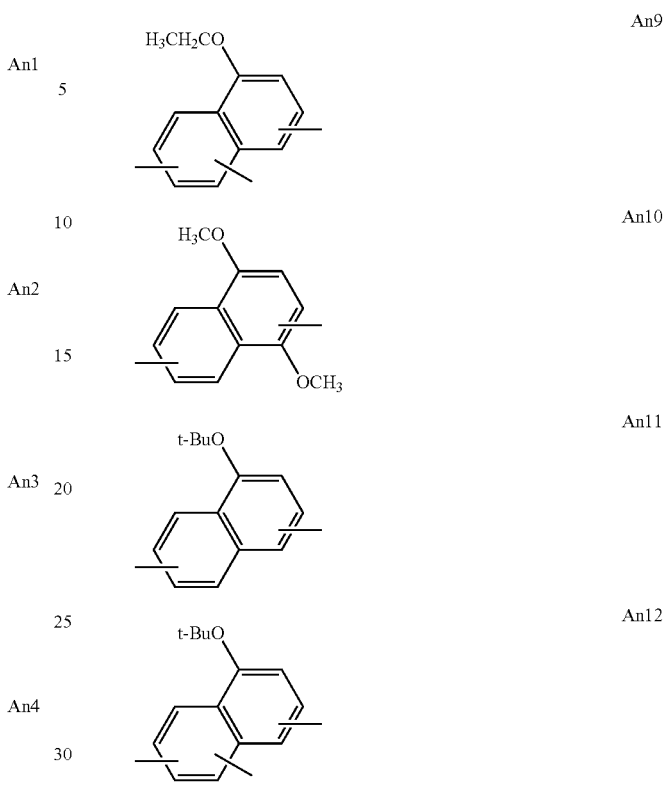

In the case where the alkoxy-group-containing fused polycyclic aromatic hydrocarbon group represented by An in the structural formulae (6) and (6-1) to (6-9) is located at a molecular terminal, the structural segment represented by any one of (An1) to (An12) above is a monovalent aromatic hydrocarbon group. Among the structures described above, those having, on the naphthalene skeleton, two or more bonding sites with other structural segments may have these bonding sites located on the same nucleus or different nuclei.

In the structural formulae (6) and (6-1) to (6-9), the structural segment represented by M is a divalent hydrocarbon group selected from a methylene group, an alkylidene group, and an aromatic-hydrocarbon-structure-containing methylene group. Examples of the alkylidene group include an ethylidene group, a 1,1-propylidene group, a 2,2-propylidene group, a dimethylene group, a propane-1,1,3,3-tetrayl group, an n-butane-1,1,4,4-tetrayl group, and an n-pentane-1,1,5,5-tetrayl group. Specific examples of the aromatic-hydrocarbon-structure-containing methylene group include structural segments represented by structural formulae (M1) to (M8) below:

[Chem. 40]

-continued

M2 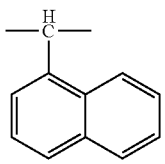

M3 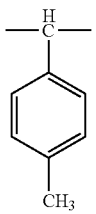

M4 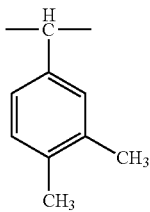

M5 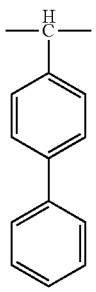

M6 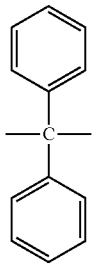

M7 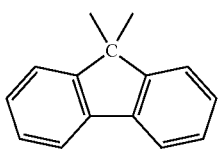

M8 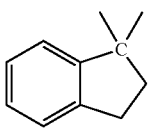

Among these, the structural segment represented by M in the structural formulae (6) and (6-1) to (6-9) is preferably a methylene group since good dielectric effects can be obtained.

The modified epoxy resin of the present invention preferably has the polyglycidyl ether structure (B2) of a novolac-type phenolic resin or the polyglycidyl ether structure (B4) of a resin having phenolic skeletons connected through an alicyclic hydrocarbon group among those phenolic-resin-derived polyglycidyl ether structures (B) since the cured product exhibits good heat resistance and dielectric properties.

The polyglycidyl ether structure (B2) of a novolac-type phenolic resin preferably has a structure selected from a phenol novolac-type epoxy resin, a cresol novolac-type epoxy resin having one or more cresol skeletons selected from ortho-cresol, para-cresol, and meta-cresol, a naphthol novolac-type epoxy resin having one or both naphthol skeletons selected from α-naphthol and β-naphthol, and a mixed novolac-type epoxy resin having two or more phenolic skeletons selected from the group consisting of phenol, cresol, and naphthol since a cured product with well-balanced heat resistance and dielectric properties, and good flame retardancy can be obtained. The phenol novolac-type epoxy resin structure is particularly preferable.

The polyglycidyl ether structure (B4) of a resin having phenolic skeletons connected through an alicyclic hydrocarbon group preferably is preferably a polyglycidyl ether structure derived from a resin having phenolic skeletons connected through a dicyclopentadiene skeleton since a cured product with better dielectric properties can be obtained. Specifically, a resin structure represented by structural formula (8) below is preferable:

[Chem. 41]

(8)

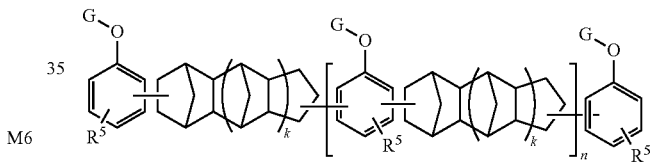

(In the formula, $R^5$ represents a hydrogen atom, an alkyl group having 1 to 4 carbon atoms, or a phenyl group, G represents a glycidyl group, and n represents an integer of 0 to 10).

As with the modified phenolic resin described above, the modified epoxy resin of the present invention has, as a substituent on an aromatic nucleus (a), a structural segment (1) represented by the following structural formula (1):

[Chem. 42]

(1)

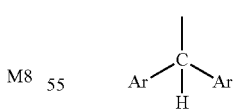

(In the formula, Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group).

The two Ar in the structural segment (1) each independently represent a phenyl group, a naphthyl group, or a structural segment having, on an aromatic nucleus, at least one substituent selected from the group consisting of an alkyl group having 1 to 4 carbon atoms, an alkoxy group having 1 to 4 carbon atoms, a halogen atom, a phenyl group, and an aralkyl group. In particular, each Ar preferably represents a phenyl group or a naphthyl group since a cured product having good heat resistance and dielectric properties can be obtained, and preferably represents a phenyl group since the modified epoxy resin can be easily produced.

The ratios of the glycidyloxy group and the structural segment represented by structural formula (1) above in the modified epoxy resin of the present invention are preferably controlled so that there is 0.1 to 2.0 mol of the structural segment represented by the structural formula (1) per mole of the glycidyloxy group since a cured product with good heat resistance and dielectric properties can be obtained. More preferably, there is 0.4 to 1.2 mol of the structural segment represented by the structural formula (1) per mole of the glycidyloxy group since a modified epoxy resin also having good solvent solubility can be obtained.

The epoxy equivalent of the modified epoxy resin of the present invention is preferably in the range of 200 to 600 g/equiv since good reactivity can be achieved and a cured product exhibits well-balanced heat resistance and dielectric properties.

The modified epoxy resin of the present invention can be prepared by, for example, a method that involves inducing a phenolic resin (I) to react with a compound (II) represented by structural formula (3) below:

[Chem. 43]

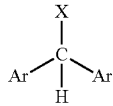

(3)

(In the formula, X represents a hydroxyl group or a halogen atom, and Ar each independently represent a phenyl group, a naphthyl group, or a structural segment having, on an aromatic nucleus, at least one substituent selected from the group consisting of an alkyl group having 1 to 4 carbon atoms, an alkoxy group having 1 to 4 carbon atoms, a halogen atom, a phenyl group, and an aralkyl group), and inducing the resulting modified phenolic resin to react with an epihalohydrin. In other words, the modified epoxy resin of the present invention can be prepared by reacting the modified phenolic resin of the present invention with an epihalohydrin.

A specific example of the method includes mixing the modified phenolic resin prepared by the aforementioned method with an epihalohydrin so that there is 2 to 10 mol of the epihalohydrin per mole of the phenolic hydroxyl group of the modified phenolic resin and then performing reaction for 0.5 to 10 hours at a temperature of 20° C. to 120° C. while adding all at the same time or gradually 0.9 to 2.0 mol of a basic catalyst per mole of the phenolic hydroxyl group of the modified phenolic resin.

Examples of the basic catalyst used here include alkaline earth metal hydroxides, alkali metal carbonates, and alkali metal hydroxides, and alkali metal hydroxides such as sodium hydroxide and potassium hydroxide are preferable since they have good catalytic activity. The basic catalysts may be used in a solid state or as an aqueous solution with a concentration of about 10% to 55% by mass. In the case where an aqueous solution is used to conduct reaction, the catalyst aqueous solution may be continuously added to the reaction system while simultaneously causing water and the epihalohydrin to flow out of the reaction system under a reduced or normal pressure condition, the resulting effluent may be separated to remove water, and the epihalohydrin may be continuously returned to the reaction system.

In conducting industrial production, all of the epihalohydrin used as a feed to produce a first batch of the modified epoxy resin is new; however, the epihalohydrin recovered from the crude reaction product and a new epihalohydrin in an amount corresponding to the amount of the epihalohydrin consumed and lost due to reaction are preferably used together for the next batch and onward. The type of epihalohydrin used is not particularly limited but examples thereof include epichlorohydrin, epibromohydrin, and β-methylepichlorohydrin. Among these, epichlorohydrin is preferable for its high industrial availability.

The reaction between the modified phenolic resin and the epihalohydrin can be performed at a higher reaction rate when performed in an organic solvent. Examples of the organic solvent used here include ketones such as acetone and methyl ethyl ketone, alcohol compounds such as methanol, ethanol, 1-propyl alcohol, isopropyl alcohol, 1-butanol, sec-butanol, and tert-butanol, cellosolves such as methyl cellosolve and ethyl cellosolve, ether compounds such as tetrahydrofuran, 1,4-dioxane, 1,3-dioxane, and diethoxyethane, and aprotic polar solvents such as acetonitrile, dimethyl sulfoxide, and dimethylformamide. These organic solvents may be used alone or in combination of two or more so as to adjust polarity.

After termination of the reaction, the unreacted epihalohydrin and the used organic solvent are distilled away under heating and reduced pressure conditions. In order to yield a modified epoxy resin with less hydrolytic halogens, the obtained crude product of the modified epoxy resin may be re-dissolved in an organic solvent such as toluene, methyl isobutyl ketone, or methyl ethyl ketone, and a reaction may further be conducted by adding an aqueous solution of an alkali metal hydroxide such as sodium hydroxide or potassium hydroxide. During this process, a phase transfer catalyst such as quaternary ammonium salts and crown ethers may be used to improve the reaction speed. The amount of the relative transfer catalyst used is preferably 0.1 to 3.0 parts by mass relative to 100 parts by mass of the modified epoxy resin used. After termination of the reaction, the produced salts are removed by filtration, washing with water, or the like, and the solvent used is distilled away under heating and reduced pressure conditions so as to obtain a target modified epoxy resin of the present invention.

The curable resin composition of the present invention contains, as essential components, the modified phenolic resin and a curing agent therefor, or the modified epoxy resin and a curing agent therefor.

Examples of the compound used as the curing agent for the modified phenolic resin in the curable resin composition of the present invention include epoxy resins.

Specific examples of the epoxy resins used here include naphthalene-skeleton-containing epoxy resins such as 1,6-diglycidyloxy naphthalene, 2,7-diglycidyloxy naphthalene, α-naphthol novolac-type epoxy resins, β-naphthol novolac-type epoxy resins, polyglycidyl ethers of α-naphthol/β-naphthol co-condensate-type novolac, naphthol aralkyl-type epoxy resins, and 1,1-bis(2,7-diglycidyloxy-1-naphthyl)alkane; bisphenol-type epoxy resins such as bisphenol A-type epoxy resins and bisphenol F-type epoxy resins; biphenyl-type epoxy resins such as biphenyl-type epoxy resins and tetramethylbiphenyl-type epoxy resins; novolac-type epoxy resins such as phenol novolac-type epoxy resins, cresol novolac-type epoxy resins, bisphenol A novolac-type epoxy resins, bisphenol F novolac-type epoxy resins, epoxylated products of condensates of a phenolic compound and a phenolic-hydroxyl-group-containing aromatic aldehyde, and biphenyl novolac-type epoxy resins; triphenyl methane-type epoxy resins; tetraphenylethane-type epoxy resins; dicyclopentadiene-phenol addition reaction-type epoxy resins; phenol aralkyl-type epoxy resins; phosphorus-atom-containing epoxy resins; and the modified epoxy resin of the present invention described above.

In the case where an epoxy resin is used as the curing agent, the blend ratios of the modified phenolic resin and the epoxy resin are preferably adjusted such that the equivalent ratio of the phenolic hydroxyl group in the modified phenolic resin to the epoxy group in the epoxy resin is 1/0.5 to 1/1.5 (phenolic hydroxyl group/epoxy group) since reactivity is good and the cured product exhibits good heat resistance.

When an epoxy resin is used as the curing agent, additional curing agents for epoxy resins may be used in combination with the modified phenolic resin of the present invention. Examples of the additional curing agents for epoxy resins include various known curing agents such as amine compounds, amide compounds, acid anhydride compounds, and phenolic compounds. Specific examples of the amine compounds include diaminodiphenylmethane, diethylenetriamine, triethylenetetramine, diaminodiphenylsulfone, isophoronediamine, imidazole, $BF_3$-amine complexes, and guanidine derivatives. Examples of the amide compounds include dicyandiamide and a polyamide resin synthesized from a dimer of linoleic acid and ethylene diamine. Examples of the acid anhydride compounds include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride. Examples of the phenolic compounds include phenol novolac resins, cresol novolac resins, aromatic hydrocarbon formaldehyde resin-modified phenolic resins, dicyclopentadiene phenol additive-type resins, phenol aralkyl resins (XYLOC resin), naphthol aralkyl resin, triphenylolmethane resins, tetraphenylolethane resins, naphthol novolac resins, naphthol-phenol co-condensed novolac resins, naphthol-cresol co-condensed novolac resins, biphenyl-modified phenolic resins (polyhydric phenol compounds having phenol nuclei connected through a bismethylene group), biphenyl-modified naphthol resins (polyhydric naphthol compounds in which phenol nuclei are connected through a bismethylene group), and polyhydric phenol compounds such as aminotriazine-modified phenolic resins (polyhydric phenol compounds having phenol nuclei connected through melamine, benzoguanamine, etc.) and alkoxy-group-containing aromatic ring-modified novolac resins (polyhydric phenol compounds having phenol nuclei and alkoxy-group-containing aromatic rings connected through formaldehydes).

In the case where the additional curing agent for epoxy resins is used, the blend ratios of the modified phenolic resin of the present invention and the additional curing agent for epoxy resins may be in any range so far as the effect of the present invention, namely, that the cured product exhibits both good heat resistance and good dielectric properties, is obtained. For example, the amount of the modified phenolic resin is preferably in the range of 5 to 95 parts by mass relative to a total of 100 parts by mass of the modified phenolic resin of the present invention and the additional curing agent for epoxy resins.

In the case where the additional curing agent for epoxy resins is used, the blend ratio thereof with respect to the epoxy resin is preferably adjusted such that the equivalent ratio of the total of active hydrogen atoms contained in the modified phenolic resin of the present invention and the additional curing agent for epoxy resins to the epoxy group contained in the epoxy resin is 1/0.5 to 1/1.5 (active hydrogen atoms/epoxy group) since reactivity is good and the cured product will have good heat resistance.

Examples of the compound used as the curing agent for the modified epoxy resin in the a curable resin composition of the present invention include various known curing agents such as amine compounds, amide compounds, acid anhydride compounds, and phenolic compounds. Specific examples of the amine compounds include diaminodiphenylmethane diethylenetriamine, triethylenetetramine, diaminodiphenylsulfone, isophoronediamine, imidazole, $BF_3$-amine complexes, and guanidine derivatives. Examples of the amide compounds include dicyandiamide and a polyamide resin synthesized from a dimer of linoleic acid and ethylene diamine. Examples of the acid anhydride compounds include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride. Examples of the phenolic compounds include phenol novolac resins, cresol novolac resins, aromatic hydrocarbon formaldehyde resin-modified phenolic resins, dicyclopentadiene phenol additive-type resins, phenol aralkyl resins (XYLOC resin), naphthol aralkyl resin, triphenylolmethane resins, tetraphenylolethane resins, naphthol novolac resins, naphthol-phenol co-condensed novolac resins, naphthol-cresol co-condensed novolac resins, biphenyl-modified phenol resins (polyhydric phenol compounds in which phenol nuclei are connected through bismethylene groups), biphenyl-modified naphthol resins (polyhydric naphthol compounds in which phenol nuclei are connected through bismethylene groups), and polyhydric phenol compounds such as aminotriazine-modified phenolic resins (polyhydric phenol compounds having phenol nuclei connected through melamine, benzoguanamine, etc.) and alkoxy-group-containing aromatic ring-modified novolac resins (polyhydric phenol compounds having phenol nuclei and alkoxy-group-containing aromatic rings connected through formaldehydes).

The blend ratios of the modified epoxy resin and these curing agents are preferably adjusted so that the equivalent ratio (epoxy group/active hydrogen atom) of the epoxy group in the modified epoxy resin and the active hydrogen atom in the curing agents is 1/0.5 to 1/1.5 since reactivity is good and the cured product will have good heat resistance.

The curable resin composition of the present invention may contain an additional epoxy resin together with the modified epoxy resin described above. Specific examples of the epoxy resins used here include naphthalene-skeleton-containing epoxy resins such as 1,6-diglycidyloxy naphthalene, 2,7-diglycidyloxy naphthalene, α-naphthol novolac-type epoxy resins, β-naphthol novolac-type epoxy resins, polyglycidyl ethers of α-naphthol/β-naphthol co-condensate-type novolac, naphthol aralkyl-type epoxy resins, and 1,1-bis(2,7-diglycidyloxy-1-naphthyl)alkane; bisphenol-type epoxy resins such as bisphenol A-type epoxy resins and bisphenol F-type epoxy resins; biphenyl-type epoxy resins such as biphenyl-type epoxy resins and tetramethylbiphenyl-type epoxy resins; novolac-type epoxy resins such as phenol novolac-type epoxy resins, cresol novolac-type epoxy resins, bisphenol A novolac-type epoxy resins, bisphenol F novolac-type epoxy resins, epoxylated products of condensates of a phenolic compound and a phenolic-hydroxyl-group-containing aromatic aldehyde, and biphenyl novolac-type epoxy resins; triphenyl methane-type epoxy resins; tetraphenylethane-type epoxy resins; dicyclopentadiene-phenol addition reaction-type epoxy resins; phenol aralkyl-type epoxy resins; phosphorus-atom-containing epoxy resins; and the modified epoxy resin of the present invention described above.

In the case where the additional epoxy resin is used, the blend ratios of the modified epoxy resin of the present invention and the additional epoxy resin may be in any range that does not impair the effect of the invention of the subject application, namely, as long as the cured product exhibits good heat resistance and good dielectric properties. For example, the amount of the modified epoxy resin is preferably in the range of 5 to 95 parts by mass relative to a total of 100 parts by mass of the two resins.

In the case where the additional epoxy resin is used, the blend ratios of the additional epoxy resin and the curing agent described above are preferably adjusted such that the equivalent ratio of the epoxy group in all epoxy components in the curable resin composition to the active hydrogen atom in the curing agent is 1/0.5 to 1/1.5 (epoxy group/active hydrogen atom) since reactivity is good and the cured product will have good heat resistance.

A curing accelerator may be properly contained in the curable resin composition of the present invention if needed. Various curing accelerators can be used and examples thereof include phosphorus compounds, tertiary amines, imidazoles, organic acid metal salts, Lewis acids, and amine complex salts. In particular, from the viewpoints of excellent curability, heat resistance, electrical properties, moisture-proof reliability, etc., 2-ethyl-4-methylimidazole is preferable among imidazole compounds, triphenylphosphine is preferred among phosphorus compounds, and 1,8-diazabicyclo-[5.4.0]-undecene (DBU) is preferred among tertiary amines.

The curable resin composition of the present invention may further contain a flame retardant, an inorganic filler, a silane coupling agent, a releasing agent, a pigment, an emulsifier, and various other additives.

Examples of non-halogen flame retardants among flame retardants include phosphorus flame retardants, nitrogen flame retardants, silicone flame retardants, inorganic flame retardants, and organic metal salt flame retardants. These may be used alone or in combination.

The phosphorus flame retardants may be organic or inorganic. Examples of the organic compounds include red phosphorus, ammonium phosphates such as monoammonium phosphate, diammonium phosphate, triammonium phosphate, and ammonium polyphosphate, and inorganic nitrogen-containing compounds such as amide phosphate.

The red phosphorus is preferably surface-treated to prevent hydrolysis and the like. Examples of the surface treatment include (i) a method of coating the surfaces with an inorganic compound such as magnesium hydroxide, aluminum hydroxide, zinc hydroxide, titanium hydroxide, bismuth oxide, bismuth hydroxide, bismuth nitrate, or any mixture of these, (ii) a method of coating the surfaces with a mixture of a thermosetting resin such as a phenolic resin and an inorganic compound such as magnesium hydroxide, aluminum hydroxide, zinc hydroxide, or titanium hydroxide, and (iii) a method of coating the surfaces with an inorganic compound such as magnesium hydroxide, aluminum hydroxide, zinc hydroxide, or titanium hydroxide, and then coating the inorganic compound with a thermosetting resin such as a phenolic resin to provide double coating.

Examples of the organophosphorus compounds include commodity organophosphorus compounds such as phosphate ester compounds, phosphonic acid compounds, phosphinic acid compounds, phosphine oxide compounds, phosphorane compounds, and organic nitrogen-containing phosphorus compounds, and cyclic organophosphorus compounds and derivatives thereof obtained by reacting the cyclic organophosphorus compounds with compounds such as epoxy resins and phenolic resins, such as 9,10-dihydro-9-oxa-10-phosphaphenanthrene=10-oxide, 10-(2,5-dihydroxyphenyl)-10H-9-oxa-10-phosphaphenanthrene=10-oxide, and 10-(2,7-dihydroxynaphthyl)-10H-9-oxa-10-phosphaphenanthrene=10-oxide.

The amounts of these compounds used are appropriately selected based on the type of the phosphorus flame retardant, other components of the curable resin composition, and the desired degree of flame retardancy. For example, in the case where red phosphorus is used as a non-halogen flame retardant in 100 parts by mass of the curable resin composition, 0.1 to 2.0 parts by mass of red phosphorus is preferably used. In the case where an organophosphorus compound is used, 0.1 to 10.0 parts by mass and more preferably 0.5 to 6.0 parts by mass of the organophosphorus compound is preferably used.

In the case where the phosphorus flame retardant is used, hydrotalcite, magnesium hydroxide, boride compounds, zirconium oxide, black dyes, calcium carbonate, zeolite, zinc molybdate, activated carbon, etc., may be used in combination with the phosphorus flame retardant.

Examples of the nitrogen flame retardant include triazine compounds, cyanuric acid compounds, isocyanuric acid compounds, and phenothiazine. Triazine compounds, cyanuric acid compounds, and isocyanuric acid compounds are preferred.

Examples of the triazine compounds include melamine, acetoguanamine, benzoguanamine, melon, melam, succinoguanamine, ethylene dimelamine, melamine polyphosphate, and triguanamine as well as the following (i) to (iv): (i) amionotriazine sulfate compounds such as guanylmelamine sulfate, melem sulfate, and melam sulfate, (ii) a co-condensate of formaldehyde, a melamine such as melamine, benzoguanamine, acetoguanamine, or formguanamine, and a phenolic compound such as phenol, cresol, xylenol, butyl phenol, or nonyl phenol, (iii) a mixture of the co-condensate (ii) and a phenolic resin such as a phenol formaldehyde condensate or the like, and (iv) (ii) and (iii) further modified with tung oil, isomerized linseed oil, or the like.

Examples of the cyanuric acid compounds include cyanuric acid and melamine cyanurate.

The amount of the nitrogen flame retardant used is appropriately selected based on the type of the nitrogen flame retardant, other components of the curable resin composition, and the desired degree of the flame retardancy. For example, the amount of the nitrogen flame retardant is preferably 0.05 to 10 parts by mass and more preferably 0.1 to 5 parts by mass in 100 parts by mass of the curable resin composition.

In the case where the nitrogen flame retardant is used, a metal hydroxide, a molybdenum compound, etc., may be used in combination.

The silicone flame retardant may be any organic compound that contains a silicon atom. Examples thereof include silicone oil, silicone rubber, and silicone resins.

The amount of the silicone flame retardant used is appropriately selected based on the type of the silicone flame retardant, other components of the curable resin composition, and the desired degree of flame retardancy. For example, 0.05 to 20 parts by mass of the silicone flame retardant is preferably contained in 100 parts by mass of the curable resin composition. The silicone flame retardant may be used in combination with a molybdenum compound, alumina, etc.

Examples of the inorganic flame retardant include metal hydroxides, metal oxides, metal carbonate compounds, metal powder, boron compounds, and low-melting-point glass.

Examples of the metal hydroxide include aluminum hydroxide, magnesium hydroxide, dolomite, hydrotalcite, calcium hydroxide, barium hydroxide, and zirconium hydroxide.

Examples of the metal oxide include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Examples of the metal carbonate compound include zinc carbonate, magnesium carbonate, calcium carbonate, barium carbonate, basic magnesium carbonate, aluminum carbonate, iron carbonate, cobalt carbonate, and titanium carbonate.

Examples of the metal powder include aluminum, iron, titanium, manganese, zinc, molybdenum, cobalt, bismuth, chromium, nickel, copper, tungsten, and tin.

Examples of the boron compound include zinc borate, zinc metaborate, barium metaborate, boric acid, and borax.

Examples of the low-melting-point glass include glassy compounds such as CEEPREE (Bokusui Brown Co., Ltd.), hydrated glass $SiO_2$—MgO—$H_2O$, and compounds based on PbO—$B_2O_3$, ZnO—$P_2O_5$—MgO, $P_2O_5$—$B_2O_3$—PbO—MgO, P—Sn—O—F, PbO—$V_2O_5$—$TeO_2$, $Al_2O_3$—$H_2O$, and lead borosilicate.

The amount of the inorganic flame retardant used is appropriately selected based on the type of the inorganic flame retardant, other components of the curable resin composition, and the desired degree of flame retardancy. For example, the amount of the inorganic flame retardant is preferably 0.5 to 50 parts by mass and more preferably 5 to 30 parts by mass in 100 parts by mass of the curable resin composition.

Examples of the organic metal salt flame retardant include ferrocene, acetylacetonate metal complexes, organic metal carbonyl compounds, organic cobalt salt compounds, organic sulfonic acid metal salts, and a compound in which a metal atom and an aromatic compound or a heterocyclic compound are ion-bonded or coordinate-bonded to each other.

The amount of the organic metal salt flame retardant used is appropriately selected based on the type of the organic metal salt flame retardant, other components of the curable resin composition, and the desired degree of flame retardancy. For example, 0.005 to 10 parts by mass of the organic metal salt flame retardant is preferably contained in 100 parts by mass of the curable resin composition.

Examples of the inorganic filler include fused silica, crystalline silica, alumina, silicon nitride, and aluminum hydroxide. Among these, fused silica is preferable since a larger amount of inorganic filler can be used. Fused silica may be crushed or spherical. In order to increase the amount of the fused silica blended and suppress the increase in melt viscosity of the curable composition, spherical fused silica is preferably mainly used. In order to increase the amount of the spherical silica used, the particle size distribution of spherical silica is preferably optimized. The filling ratio is preferably in the range of 0.5 to 100 parts by mass in 100 parts by mass of the curable resin composition.

In the case where the curable resin composition of the present invention is used in a conductive paste or the like, a conductive filler such as silver powder or copper powder can be used.

In order to prepare a varnish for printed wiring substrates from the curable resin composition of the present invention, an organic solvent is preferably added. Examples of the organic solvent that can be used for this include methyl ethyl ketone, acetone, dimethylformamide, methyl isobutyl ketone, methoxypropanol, cyclohexanone, methyl cellosolve, ethyl diglycol acetate, and propylene glycol monomethyl ether acetate. The choice and the appropriate amount of the organic solvent can be determined according to usage. For example, for printed wiring substrate use, a polar solvent having a boiling point of 160° C. or lower, such as methyl ethyl ketone, acetone, or dimethylformamide, is preferable, and such a solvent is preferably used at a ratio that yields a nonvolatile content of 40% to 80% by mass. For build-up adhesive film use, ketones such as acetone, methyl ethyl ketone, and cyclohexanone, acetic acid esters such as ethyl acetate, butyl acetate, cellosolve acetate, propylene glycol monomethyl ether acetate, and carbitol acetate, carbitols such as cellosolve and butyl carbitol, aromatic hydrocarbons such as toluene and xylene, dimethylformamide, dimethylacetamide, and N-methylpyrrolidone are preferably used. These solvents are preferably used at a ratio that yields a nonvolatile content of 30% to 60% by mass.

The curable resin composition of the present invention is obtained by homogeneously mixing the components described above. The curable resin composition can be easily formed into a cured product by the same method as those conventionally known. Examples of the cured product include shaped cured products such as a multilayer product, a cast molded product, an adhesive layer, a coating film, and a film.

Examples of the usage of the curable resin composition of the present invention include printed wiring board materials, resin cast-molding materials, interlayer insulating materials for build-up substrates, and adhesive films for build-up. When the curable resin composition is used in printed wiring boards, as an insulating material for electronic circuit substrates, or in an adhesive film for build-up among these usages, the curable resin composition can be used as an insulating material for a so-called electronic-parts-embedded substrate having passive parts such as capacitors and active parts such as IC chips embedded inside the substrate. In particular, the curable resin composition is preferably used as a printed wiring board material or in an adhesive film for build-up due to its properties such as high heat resistance and flame retardancy.

An example of a method for manufacturing a printed circuit substrate from the curable resin composition of the present invention is a method that includes impregnating a reinforcing substrate with a resin composition varnished by addition of the organic solvent (C), placing a copper foil on the reinforcing substrate, and performing thermal press bonding. Examples of the reinforcing substrate that can be used include paper, glass cloth, glass unwoven cloth, aramid paper, aramid cloth, glass mat, and glass roving cloth. This method can be described in further detail as follows. First, the varnish-type curable resin composition described above is heated to a heating temperature suitable for the type of the solvent used, preferably a temperature of 50 to 170° C., to obtain a prepreg, which is a cured product. The mass ratio of the curable resin composition to the reinforcing substrate is not particularly limited but the resin content in the prepreg is usually preferably adjusted to 20% to 60% by mass. Then prepregs obtained as above are stacked by a normal method with copper foils being placed thereon, and thermal press-bonding is performed at a pressure 1 to 10 MPa at 170° C. to 250° C. for 10 minutes to 3 hours. As a result, a target printed circuit substrate can be obtained.

The curable composition of the present invention can be used as a resist ink as follows, for example. That is, a composition for forming a resist ink is prepared by using a cationic polymerization catalyst as a catalyst of the curable composition, a pigment, talc, and a filler, and the composition is applied to a printed substrate by a screen printing technique. Then the applied resist ink is cured to form a resist ink cured product.

The curable composition of the present invention can be used as conductive paste as follows, for example. That is, fine conductive particles may be dispersed in the curable resin composition to prepare a composition for an anisotropic conductive film, or the curable composition can be prepared into a paste resin composition for circuit interconnections and anisotropic conductive adhesives that are liquid at room temperature.

An example of a method for obtaining an interlayer insulating material for a build-up substrate from the curable composition of the present invention includes applying the curable composition containing rubber, a filler, and any other suitable additives to a circuit-embedded wiring substrate by spray coating method, a curtain coating method, or the like, followed by curing of the applied composition. Then, if needed, holes such as particular through holes are formed, a treatment with a roughening agent is performed, and the surface of the resulting structure is rinsed with warm water so as to form irregularities and plate metals such as copper. Preferable examples of the plating method include electroless plating and electrolytic plating. Examples of the roughening agent include an oxidant, an alkali, and an organic solvent. Such operation is sequentially repeated as desired so as to alternately build up insulating layers and conductor layers of particular circuit patterns so as to obtain a build-up board. Formation of holes such as through holes are conducted after forming the outermost resin insulating layer. Alternatively, a build-up substrate can also be prepared by thermally press-bonding a resin-clad copper foil formed by semi-curing the curable composition on a copper foil onto a wiring substrate having a circuit at 170° C. to 250° C. In this manner, a build-up substrate can be fabricated without surface roughening and performing plating.

An example of the method for producing an adhesive film for build-up from the curable composition of the present invention is a method that involves applying the curable composition of the present invention to a supporting film to form a resin composition layer and to thereby form an adhesive film for multilayer printed wiring boards.

In the case where the curable composition of the present invention is used in an adhesive film for build-up, the adhesive film should soften under temperature conditions of laminating in a vacuum lamination technique (normally, 70° C. to)140° and exhibit flowability (resin flow) that enables filling of via holes or through holes in the circuit board with the resin at the same time as performing lamination on the circuit substrate. The components described above are preferably blended so that such properties are achieved.

The diameter of the through holes in the multilayer printed wiring boards is usually 0.1 to 0.5 mm and the depth is usually 0.1 to 1.2 mm. Preferably, filling with the resin in enabled within these ranges. In the case where both sides of the circuit board are to be laminated, through holes are preferably filled up to about ½.

Specifically, the adhesive film can be produced by preparing a varnish-type curable composition of the present invention, applying the varnish-type composition to a surface of a supporting film (y), and drying the organic solvent by heating or blowing hot air so as to form a layer (x) of the curable resin composition.

The thickness of the layer (x) formed is usually equal to or greater than the thickness of a conductor layer. The thickness of a conductor layer of a circuit board is usually in the range of 5 to 70 μm. Thus, the thickness of the resin composition layer is preferably 10 to 100 μm.

The layer (x) of the present invention may be protected with a protective film described below. Deposition of dust and the like onto the surface of the curable composition layer and scratches can be prevented by providing protection with the protective film.

Examples of the supporting film and the protective film include polyolefins such as polyethylene, polypropylene, and polyvinyl chloride, polyesters such as polyethylene terephthalate (hereinafter may be referred to as PET) and polyethylene naphthalate, polycarbonates, polyimides, releasing paper, and metal foils such as copper foils and aluminum foils. The supporting film and the protective film may be subjected to a matting process, a corona process, and/or a releasing process.

The thickness of the supporting film is not particularly limited and is usually 10 to 150 μm and preferably in the range of 25 to 50 μm. The thickness of the protective film is preferably 1 to 40 μm.

The supporting film (y) is removed after it is laminated to the circuit substrate or after forming an insulating layer by thermal curing. Deposition of dust and the like during the curing step can be prevented by removing the supporting film (y) after thermal curing of the adhesive film. In the case where the film is removed after curing, the supporting film is typically subjected to a releasing treatment in advance.

A multilayer printed wiring board is produced by using the above-described adhesive film as follows. For example, in the case where the layer (x) is protected with a protective film, the protective film is removed, and the adhesive film is laminated by a vacuum lamination technique, for example, onto one or both sides of a circuit substrate so that the layer (x) is in direct contact with the circuit substrate. The lamination method may be a batch type or a continuous type using rollers. The adhesive film and the circuit substrate may be heated (preheat) prior to conducting lamination if needed.

As for the lamination conditions, the press-bonding temperature (laminating temperature) is preferably 70° C. to 140° C., press-bonding pressure is preferably 1 to 11 kgf/cm$^2$ (9.8×104 to 107.9×104 N/m2), and air pressure is preferably 20 mmHg (26.7 hPa) or less so that lamination is conducted at a reduced pressure.

A cured product of the present invention may be obtained by heating the composition obtained by the method described above in a temperature range of about 20° C. to about 250° C.

EXAMPLES

Next, the present invention is specifically described through Examples and Comparative Examples. In the description below, "parts" and "%" are on a mass basis unless otherwise noted. GPC and MS were measured under the following conditions.
GPC: Measurement conditions were as follows:
Measurement instrument: "HLC-8220 GPC" produced by Tosoh Corporation
Columns: Guard column "HXL-L" produced by Tosoh Corporation
+ "TSK-GEL G2000HXL" produced by Tosoh Corporation
+ "TSK-GEL G2000HXL" produced by Tosoh Corporation
+ "TSK-GEL G3000HXL" produced by Tosoh Corporation
+ "TSK-GEL G4000HXL" produced by Tosoh Corporation
Detector: RI (differential refractometer)
Data processing: "GPC-8020 model II, version 4.10" produced by Tosoh Corporation
Measurement conditions:
　Column temperature: 40° C.
　Development solvent: tetrahydrofuran
　Flow rate: 1.0 ml/min
Standard: The following monodisperse polystyrenes with known molecular weights were used in accordance with the measurement manual of "GPC-8020 model II, version 4.10":
　(Polystyrenes Used)
　"A-500" produced by Tosoh Corporation
　"A-1000" produced by Tosoh Corporation
　"A-2500" produced by Tosoh Corporation
　"A-5000" produced by Tosoh Corporation
　"F-1" produced by Tosoh Corporation
　"F-2" produced by Tosoh Corporation
　"F-4" produced by Tosoh Corporation
　"F-10" produced by Tosoh Corporation
　"F-20" produced by Tosoh Corporation
　"F-40" produced by Tosoh Corporation
　"F-80" produced by Tosoh Corporation
　"F-128" produced by Tosoh Corporation
Sample: A 1.0% by mass tetrahydrofuran solution on a resin solid basis was filtered with a microfilter (50 μl).
MS: double focusing-type mass spectrometer AX505H (FD505H) produced by JEOL Ltd.

Example 1

Production of Modified Phenolic Resin (1)

Into a flask equipped with a thermometer, a dropping funnel, a cooling tube, a distillation column, and a stirrer, 520 parts by mass (5.0 mol) of a phenol novolac resin ("TD-2131" produced by DIC Corporation, hydroxyl equivalent: 104 g/equiv), 552 parts by mass (3.0 mol) of benzhydrol, and 10.7 parts by mass (0.06 mol) of para-toluenesulfonic acid were placed, and the resulting mixture was stirred at 100° C. for 3 hours while blowing nitrogen. Upon termination of the reaction, 1608 parts by mass of methyl isobutyl ketone was added thereto, and the resulting mixture was neutralized by adding 4.6 parts by mass (0.06 mol) of a 49% aqueous sodium hydroxide solution. The organic layer was washed with 500 parts by mass of water three times, and then methyl isobutyl ketone was removed under heating at a reduced pressure. As a result, 1010 parts by mass of a modified phenolic resin (1) having the structural segment (a) and the structural segment (b) shown below as repeating units was obtained. The hydroxyl equivalent of the modified phenolic resin (1) was 210 g/equiv. A GPC chart and an MS spectrum of the modified phenolic resin (1) are shown in FIG. 1 and FIG. 2, respectively.

[Chem. 44]

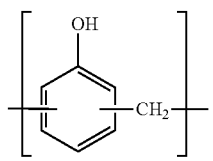

(a)

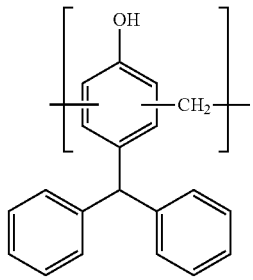

(b)

Example 2

Production of Modified Epoxy Resin (1)

Into a flask equipped with a thermometer, a cooling tube, and a stirrer, 105 parts by mass (hydroxyl equivalent: 0.5 equiv) of the modified phenolic resin (1) obtained in Example 1, 463 parts by mass (5.0 mol) of epichlorohydrin, and 53 parts by mass of n-butanol were placed and the resin was dissolved under nitrogen gas purging. After the temperature of the resulting mixture was elevated to 50° C., 110 parts by mass (0.55 mol) of a 20% aqueous sodium hydroxide solution was added to the mixture for 3 hours, and the reaction was performed at 50° C. for 1 hour. After termination of the reaction, unreacted epichlorohydrin was distilled away under 150° C. reduced pressure conditions, and the resulting crude product was dissolved with 300 parts by mass of methyl isobutyl ketone and 50 parts by mass of n-butanol. To the resulting solution, 15 parts by mass of a 10% aqueous sodium hydroxide solution was added, the reaction was conducted at 80° C. for 2 hours, and then the product was washed with 100 parts by mass of water three times until the pH of the washing solution was neutral. The system was then azeotropically dehydrated, microfiltration was conducted, and the solvent was distilled away under reduced pressure conditions. As a result, 130 parts by mass of a modified epoxy resin (1) having the structural segment (c) and the structural segment (d) shown below as repeating units was obtained. The epoxy equivalent of the modified epoxy resin (1) was 260 g/equiv. A GPC chart and an MS spectrum of the modified epoxy resin (1) are shown in FIG. 3 and FIG. 4, respectively.

[Chem. 45]

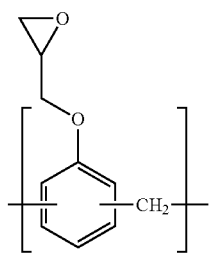

(c)

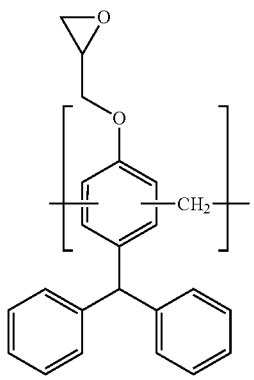

Example 3

Production of Modified Phenolic Resin (2)

Into a flask equipped with a thermometer, a dropping funnel, a cooling tube, a distillation column, and a stirrer, 850 parts by mass (5.0 mol) of a dicyclopentadiene-skeleton-containing phenolic resin ("J-DPP-85" produced by JFE Chemical Corporation, hydroxyl equivalent: 170 g/equiv), 552 parts by mass (3.0 mol) of benzhydrol, and 14.0 parts by mass (0.07 mol) of para-toluenesulfonic acid were placed, and the resulting mixture was stirred at 100° C. for 3 hours while blowing nitrogen. Upon termination of the reaction, 2103 parts by mass of methyl isobutyl ketone was added, and 6.0 parts by mass (0.07 mol) of a 49% aqueous sodium hydroxide solution was added to the resulting mixture to neutralize the mixture. The organic layer was washed with 500 parts by mass of water three times, and then methyl isobutyl ketone was removed under heating at a reduced pressure. As a result, 1340 parts by mass of a modified phenolic resin (2) having the structural segment (e) and the structural segment (f) shown below as repeating units was obtained. The hydroxyl equivalent of the modified phenolic resin (2) was 270 g/equiv. A GPC chart and an MS spectrum of the modified phenolic resin (2) are shown in FIG. 5 and FIG. 6, respectively.

[Chem. 46]

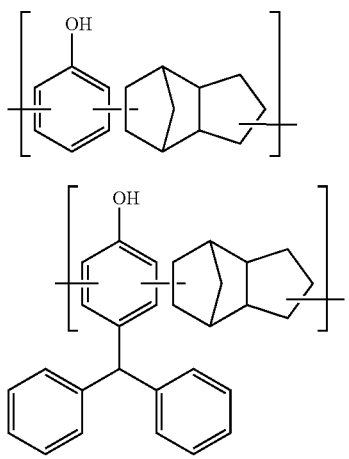

Example 4

Production of Modified Epoxy Resin (2)

Into a flask equipped with a thermometer, a cooling tube, and a stirrer, 135 parts by mass (hydroxyl equivalent: 0.5 equiv) of the modified phenolic resin (2) obtained in Example 3, 463 parts by mass (5.0 mol) of epichlorohydrin, and 53 parts by mass of n-butanol were placed and the resin was dissolved under nitrogen gas purging. After the temperature of the resulting mixture was elevated to 50° C., 110 parts by mass (0.55 mol) of a 20% aqueous sodium hydroxide solution was added to the mixture for 3 hours, and the reaction was performed at 50° C. for 1 hour. After termination of the reaction, unreacted epichlorohydrin was distilled away under 150° C. reduced pressure conditions, and the resulting crude product was dissolved with 300 parts by mass of methyl isobutyl ketone and 50 parts by mass of n-butanol. To the resulting solution, 15 parts by mass of a 10% aqueous sodium hydroxide solution was added, the reaction was conducted at 80° C. for 2 hours, and then the product was washed with 100 parts by mass of water three times until the pH of the washing solution was neutral. The system was then azeotropically dehydrated, microfiltration was conducted, and the solvent was distilled away under reduced pressure conditions. As a result, 160 parts by mass of a modified epoxy resin (2) having the structural segment (g) and the structural segment (h) shown below as repeating units was obtained. The epoxy equivalent of the modified epoxy resin (2) was 326 g/equiv. A GPC chart and an MS spectrum of the modified epoxy resin (2) are shown in FIG. 7 and FIG. 8, respectively.

[Chem. 47]

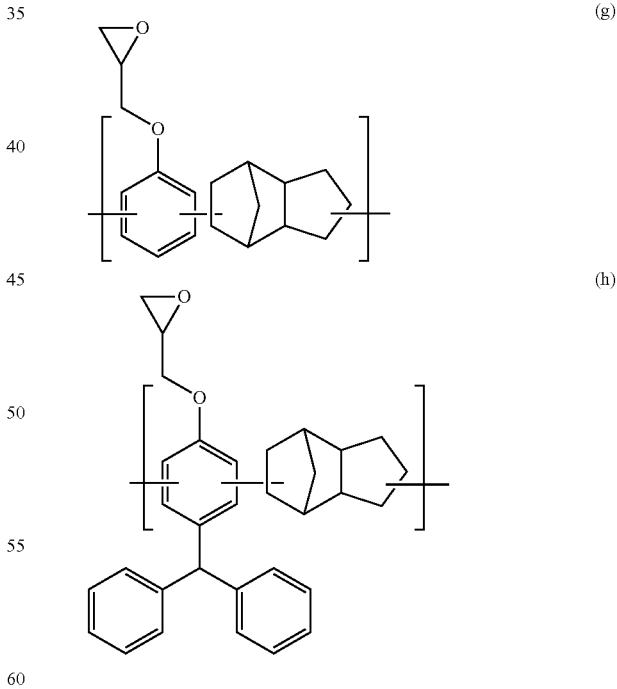

Comparative Production Example 1

Production of Phenolic Resin (1')

Into a flask equipped with a thermometer, a dropping funnel, a cooling tube, a distillation column, and a stirrer, 520 parts by mass (5.0 mol) of a phenol novolac resin ("TD-2131" produced by DIC Corporation, hydroxyl equivalent: 104 g/equiv), 324 parts by mass (3.0 mol) of benzyl alcohol, and 8.4 parts by mass (0.04 mol) of para-toluenesulfonic acid were placed, and the resulting mixture was stirred at 100° C. for 3 hours while blowing nitrogen. Upon termination of the reaction, 1608 parts by mass of methyl isobutyl ketone was added thereto, and the resulting mixture was neutralized by adding 3.6 parts by mass (0.04 mol) of a 49% aqueous sodium hydroxide solution. The organic layer was washed with 500 parts by mass of water three times, and then methyl isobutyl ketone was removed under heating at a reduced pressure. As a result, 770 parts by mass of a phenolic resin (1') having the structural segment (i) and the structural segment (j) shown below as repeating units was obtained. The hydroxyl equivalent of the phenolic resin (1') was 160 g/equiv.

[Chem. 48]

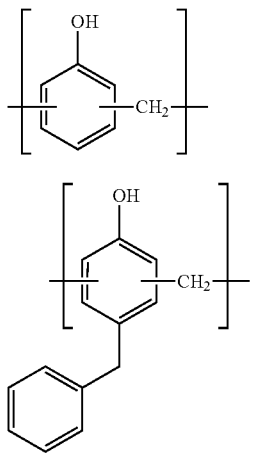

Comparative Production Example 2

Production of Epoxy Resin (1')

Into a flask equipped with a thermometer, a cooling tube, and a stirrer, 80 parts by mass (hydroxyl equivalent: 0.5 eq.) of the phenolic resin (A1') obtained in Comparative Production Example 1, 463 parts by mass (5.0 mol) of epichlorohydrin, and 53 parts by mass of n-butanol were placed and the resin was dissolved under nitrogen gas purging. After the temperature of the resulting mixture was elevated to 50° C., 110 parts by mass (0.55 mol) of a 20% aqueous sodium hydroxide solution was added to the mixture for 3 hours, and the reaction was performed at 50° C. for 1 hour. After termination of the reaction, unreacted epichlorohydrin was distilled away under 150° C. reduced pressure conditions, and the resulting crude product was dissolved with 300 parts by mass of methyl isobutyl ketone and 50 parts by mass of n-butanol. To the resulting solution, 15 parts by mass of a 10% aqueous sodium hydroxide solution was added, the reaction was conducted at 80° C. for 2 hours, and then the product was washed with 100 parts by mass of water three times until the pH of the washing solution was neutral. The system was then azeotropically dehydrated, microfiltration was conducted, and the solvent was distilled away under reduced pressure conditions. As a result, 100 parts by mass of an epoxy resin (1') having the structural segment (ki) and the structural segment (1) shown below as repeating units was obtained. The epoxy equivalent of the epoxy resin (1') was 240 g/equiv

[Chem. 49]

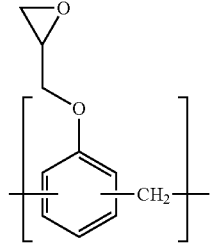

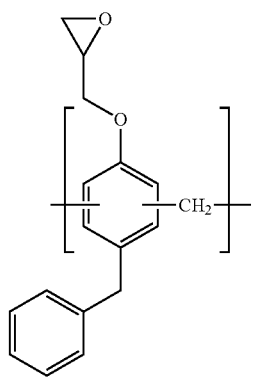

Examples 5 and 6 and Comparative Example 1

Curable resin compositions and multilayer boards were prepared by the procedure described below, and evaluation was conducted. The results are shown in Table 1.

<Preparation of Curable Compositions>

A phenol novolac-type epoxy resin ("N-770" produced by DIC Corporation, epoxy equivalent: 190 g/equiv), one of the modified phenolic resins (1) and (2) and the phenolic resin (1') obtained as described above, 2-ethyl-4-methylimidazol (2E4MZ) serving as a curing accelerator, and methyl ethyl ketone were blended according to the compositions shown in Table 1 to obtain curable resin compositions.

<Preparation of Multilayer Boards>

Multilayer boards were prepared under the following conditions by using the curable compositions obtained as above.

Substrate: Glass cloth "#2116" (210×280 mm) produced by Nitto Boseki Co., Ltd.
Number of plies: 6
Conditions of prepreg formation: 160° C.
Curing conditions: 200° C., 40 kg/cm2 for 1.5 hours
Thickness of the board after forming: 0.8 mm <Measurement of Dielectric Constant and Dielectric Tangent>

Each multilayer board obtained as above was absolutely dried and then stored in a room having a temperature of 23° C. and a humidity of 50% for 24 hours to prepare a test specimen. The test specimen was analyzed according to JIS-C-6481 by using Impedance Material Analyzer "HP4291B" produced by Agilent Technologies to determine the dielectric constant and dielectric tangent at 1 GHz. The results are shown in Table 1 below.

<Evaluation of Heat Resistance (Glass Transition Temperature)>

The multilayer board obtained as above was analyzed with a viscoelasticity meter (DMA: solid analyzer RSA II produced by Rheometrics, Inc., rectangular tension method, frequency: 1 Hz, heating rate: 3 ° C./min) to determine the viscoelasticity. The temperature at which the change in viscoelasticity was the largest (the rate of change in tan δ was the largest) was assumed to be the glass transition temperature. The results are shown in Table 1.

<Flame Retardancy Test>

The multilayer board obtained by using the modified phenolic resin (1) or the phenolic resin (1') was subjected to a flame retardancy test according to UL-94 vertical testing method. The multilayer board obtained by using the modified phenolic resin (1) exhibited a V-1 level flame retardancy whereas the multilayer board obtained by using the phenolic resin (1') underwent burning.

TABLE 1

|  | Example 5 | Example 6 | Comparative Example 1 |
|---|---|---|---|
| Epoxy resin "N-770" | 100 | 100 | 100 |
| Modified phenolic resin (1) | 111 | | |
| Modified phenolic resin (2) | | 142 | |
| Phenolic resin (1') | | | 84 |
| Curing accelerator 2E4MZ | 0.2 | 0.2 | 0.2 |
| Methyl ethyl ketone | 153 | 175 | 133 |
| Dielectric constant (1 GHz) | 4.0 | 3.7 | 4.4 |
| Dielectric tangent (1 GHz) | 0.019 | 0.015 | 0.022 |
| DMA Tg (° C.) | 177 | 162 | 160 |

Examples 7 and 8, and Comparative Example 2

Curable resin compositions were prepared by the procedure described below. Multilayer boards were prepared by using the curable resin compositions as in Examples 5 and 6 and evaluation was performed. The results are shown in Table 2.

<Preparation of Curable Compositions>

A phenol novolac resin ("TD-2090" produced by DIC Corporation, hydroxyl equivalent: 105 g/equiv), one of the modified epoxy resins (1) and (2) and the epoxy resin (1') obtained as described above, 2-ethyl-4-methylimidazol (2E4MZ) serving as a curing accelerator, and methyl ethyl ketone were blended according to the compositions shown in Table 2 to obtain curable resin compositions.

<Flame Retardancy Test>

The multilayer board obtained by using the modified epoxy resin (1) or the epoxy resin (1') was subjected to a flame retardancy test according to UL-94 vertical testing method. The multilayer board obtained by using the modified epoxy resin (1) exhibited a V-1 level flame retardancy whereas the multilayer board obtained by using the epoxy resin (1') underwent burning.

TABLE 2

|  | Example 7 | Example 8 | Comparative Example 2 |
|---|---|---|---|
| Phenol novolac resin "TD-2090" | 40 | 32 | 44 |

TABLE 2-continued

|  | Example 7 | Example 8 | Comparative Example 2 |
|---|---|---|---|
| Modified epoxy resin (1) | 100 | | |
| Modified epoxy resin (2) | | 100 | |
| Epoxy resin (1') | | | 100 |
| Curing accelerator 2E4MZ | 0.1 | 0.1 | 0.1 |
| Methyl ethyl ketone | 101 | 96 | 104 |
| Dielectric constant (1 GHz) | 4.0 | 3.8 | 4.5 |
| Dielectric tangent (1 GHz) | 0.020 | 0.016 | 0.024 |
| DMA Tg (° C.) | 189 | 178 | 172 |

The invention claimed is:

1. A modified phenolic resin comprising a phenolic resin structure (A), wherein at least one aromatic nucleus (a) in the phenolic resin structure (A) has, as a substituent, a structural segment (1) represented by structural formula (1) below:

[Chem. 1]

(1)

(In the formula, Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group).

2. The modified phenolic resin according to claim 1, wherein the phenolic resin structure (A) is any one selected from a bisphenol-type resin structure (A1), a novolac-type phenolic resin structure (A2), an aralkyl-type phenolic resin structure (A3), a resin structure (A4) having phenolic skeletons connected through an alicyclic hydrocarbon group, and a resin structure (A5) that contains a structural segment represented by structural formula (2) below:

[Chem. 2]

(2)

(In the formula, Ph represents a phenolic-hydroxyl-group-containing aromatic hydrocarbon group, M represents a divalent hydrocarbon group selected from a methylene group, an alkylidene group, and an aromatic-hydrocarbon-structure-containing methylene group, and An represents an alkoxy-group-containing fused polycyclic aromatic hydrocarbon group).

3. A method for producing a modified phenolic resin, comprising inducing a phenolic resin (I) to react with a compound (II) represented by structural formula (3) below:

[Chem. 3]

(3)

(In the formula, X represents a hydroxyl group or a halogen atom, and Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group), the reaction being conducted in such a manner that there is 0.1 to 2.0 mol of the compound (II) per mole of a phenolic hydroxyl group contained in the phenolic resin (I).

4. A modified phenolic resin obtained by the method according to claim 3.

5. A modified epoxy resin comprising a polyglycidyl ether structure (B) of a phenolic resin, wherein at least one aromatic nucleus (a) in the polyglycidyl ether structure (B) of a phenolic resin has, as a substituent, a structural segment (1) represented by structural formula (1) below:

[Chem. 4]

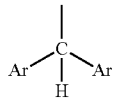
(1)

(In the formula, Ar each independently represent a phenyl group, a naphthyl group, or a structural segment having, on an aromatic nucleus of a phenyl or naphthyl group, at least one substituent selected from the group consisting of an alkyl group having 1to 4 carbon atoms, an alkoxy group having 1 to 4 carbon atoms, a halogen atom, a phenyl group, and an aralkyl group).

6. The modified epoxy resin according to claim 5, wherein the polyglycidyl ether structure (B) of a phenolic resin is any one selected from a polyglycidyl ether structure (B1) of a bisphenol-type resin, a polyglycidyl ether structure (B2) of a novolac-type phenolic resin, a polyglycidyl ether structure (B3) of an aralkyl-type phenolic resin, a polyglycidyl ether structure (B4) of a resin having phenolic skeletons connected through an alicyclic hydrocarbon group, and a resin structure (B5) represented by structural formula (2) below:
[Chem. 5]

-Ph-M-An- (2)

(In the formula, Ph represents a glycidyl-ether-group-containing aromatic hydrocarbon group, M represents a divalent hydrocarbon group selected from a methylene group, an alkylidene group, and an aromatic-hydrocarbon-structure-containing methylene group, and An represents an alkoxy-group-containing fused polycyclic aromatic hydrocarbon group).

7. A method for producing a modified epoxy resin, comprising inducing a phenolic resin (I) to react with a compound (II) represented by structural formula (3) below:

[Chem. 6]

(In the formula, X represents a hydroxyl group or a halogen atom, and Ar each independently represent a phenyl group, a naphthyl group, or a structural segment having, on an aromatic nucleus of a phenyl or naphthyl group, at least one substituent selected from the group consisting of an alkyl group having 1 to 4 carbon atoms, an alkoxy group having 1 to 4 carbon atoms, a halogen atom, a phenyl group, and an aralkyl group), the reaction being conducted in such a manner that there is 0.1 to 2.0 mol of the compound (II) per mole of a phenolic hydroxyl group contained in the phenolic resin (I), and inducing the resulting modified phenolic resin to react with an epihalohydrin.

8. A modified epoxy resin obtained by the method according to claim 7.

9. A curable resin composition comprising the modified phenolic resin according to claim 1 and a curing agent.

10. A curable resin composition comprising the modified epoxy resin according to claim 5 and a curing agent.

11. A cured product obtained by curing the curable resin composition according to claim 9.

12. A printed wiring substrate obtained by impregnating a reinforcing substrate with a varnish composition containing the curable resin composition according to claim 9 and an organic solvent, placing a copper foil on the reinforcing substrate, and performing thermal press-bonding.

* * * * *